United States Patent
Harada

(10) Patent No.: US 12,127,386 B2
(45) Date of Patent: Oct. 22, 2024

(54) SEMICONDUCTOR MEMORY DEVICE

(71) Applicant: Unisantis Electronics Singapore Pte. Ltd., Singapore (SG)

(72) Inventor: Nozomu Harada, Tokyo (JP)

(73) Assignee: UNISANTIS ELECTRONICS SINGAPORE PTE. LTD., Singapore (SG)

(*) Notice: Subject to any disclaimer, the term of this patent is extended or adjusted under 35 U.S.C. 154(b) by 310 days.

(21) Appl. No.: 17/567,696

(22) Filed: Jan. 3, 2022

(65) Prior Publication Data
US 2022/0139928 A1    May 5, 2022

Related U.S. Application Data

(63) Continuation of application No. PCT/JP2020/012471, filed on Mar. 19, 2020.

(30) Foreign Application Priority Data

Jul. 11, 2019 (WO) ............... PCT/JP2019/027541

(51) Int. Cl.
*H10B 10/00* (2023.01)
*H01L 21/311* (2006.01)
(Continued)

(52) U.S. Cl.
CPC ........ *H10B 10/12* (2023.02); *H01L 21/31116* (2013.01); *H01L 21/31144* (2013.01);
(Continued)

(58) Field of Classification Search
CPC . H10B 10/12; H10B 10/125; H01L 21/76816; H01L 29/4234; H01L 29/66666;
(Continued)

(56) References Cited

U.S. PATENT DOCUMENTS

2002/0002415 A1    1/2002 Mugibayashi et al.
2010/0207201 A1*   8/2010 Masuoka ............ H01L 27/088
                                              257/329
(Continued)

FOREIGN PATENT DOCUMENTS

JP   H02-188966 A    7/1990
JP   2013-069770 A   4/2013
(Continued)

OTHER PUBLICATIONS

English translation of International Preliminary Report on Patentability in Application No. PCT/JP2020/012471, dated Jan. 20, 2022, 6 pages.
(Continued)

*Primary Examiner* — Mohammad M Hoque
(74) *Attorney, Agent, or Firm* — Crowell & Moring LLP

(57) ABSTRACT

P+ layers 32b and 32e that cover the entire top portions of Si pillars 6b and 6e and surround the Si pillars 6b and 6e with an equal width in plan view are formed in a self-aligned manner with the Si pillars 6b and 6e. W layers 33b and 33e are formed on the P+ layers 32b and 32e. A band-shaped contact hole C3 that is partly in contact with regions of the W layers 33b and 33e and that extends in the Y direction is formed. A power supply wiring metal layer Vdd is formed such that the band-shaped contact hole C3 is filled with the power supply wiring metal layer Vdd. In plan view, regions of the W layers 33b and 33e partly protrude outward from the band-shaped contact hole C3.

6 Claims, 33 Drawing Sheets

(51) Int. Cl.
*H01L 21/768* (2006.01)
*H01L 29/423* (2006.01)
*H01L 29/66* (2006.01)
*H01L 29/78* (2006.01)

(52) U.S. Cl.
CPC .... *H01L 21/76816* (2013.01); *H01L 29/4234* (2013.01); *H01L 29/66666* (2013.01); *H01L 29/7827* (2013.01)

(58) Field of Classification Search
CPC ........... H01L 29/7827; H01L 21/31116; H01L 21/31144; Y10S 257/903
USPC ....................................................... 257/288
See application file for complete search history.

(56) References Cited

U.S. PATENT DOCUMENTS

2010/0219483 A1  9/2010  Masuoka et al.
2015/0287821 A1* 10/2015 Masuoka .............. H01L 27/092
                                                     257/329
2019/0109140 A1  4/2019  Masuoka et al.
2019/0237367 A1  8/2019  Masuoka et al.

FOREIGN PATENT DOCUMENTS

| | | |
|---|---|---|
| JP | 2016-021590 A | 2/2016 |
| WO | WO 2009/096465 A1 | 8/2009 |
| WO | WO 2017/208486 A1 | 12/2017 |
| WO | WO 2018/123823 A1 | 7/2018 |

OTHER PUBLICATIONS

Takato et al.,: "Impact of Surrounding Gate Transistor (SGT) for Ultra-High-Density LSI's", IEEE Transaction on Electron Devices, vol. 38, No. 3, pp. 573-578 (1991), 6 pages.

Raley et al.,: "Self-aligned quadruple patterning integration using spacer on spacer pitch splitting at the resist level for sub-32nm pitch applications" Proc. Of SPIE vol. 9782, 2016, 15 pages.

International Search Report and Written Opinion in Application No. PCT/JP2020/012471, dated Jun. 9, 2020, 11 pages.

* cited by examiner

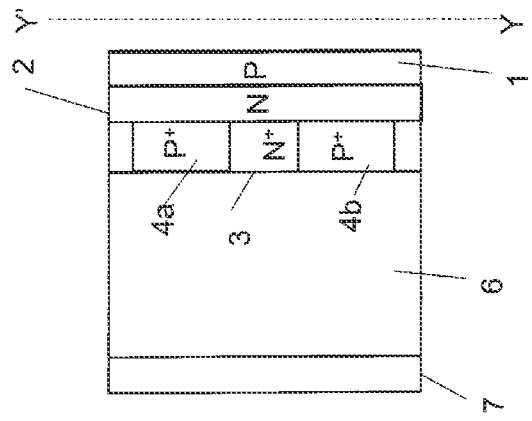
FIG. 1BC
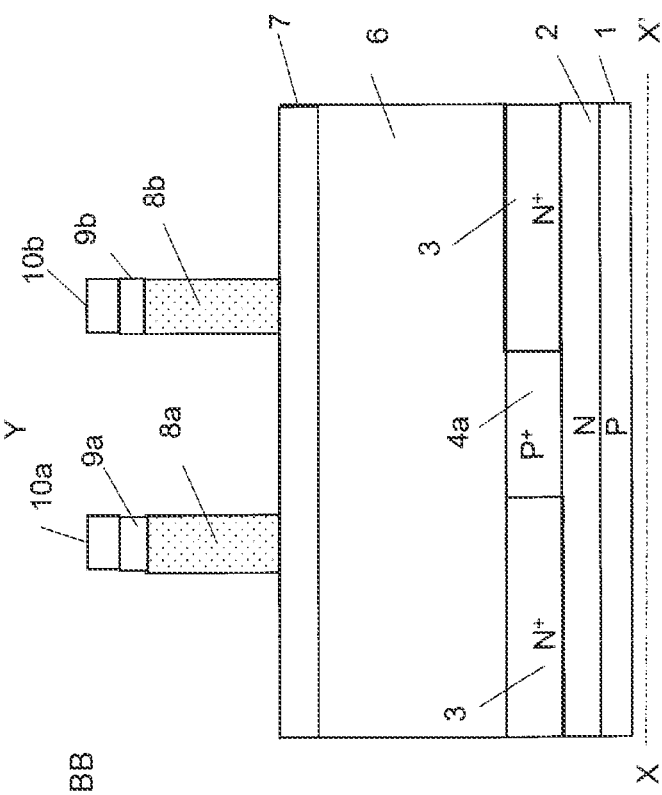
FIG. 1BA
FIG. 1BB

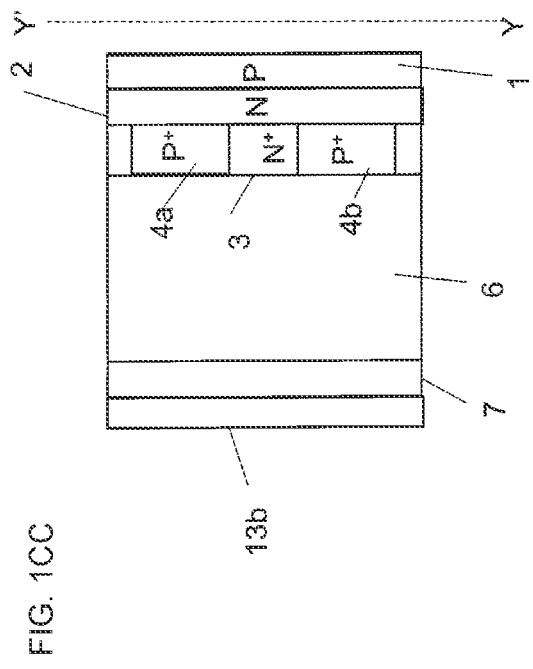
FIG. 1CC
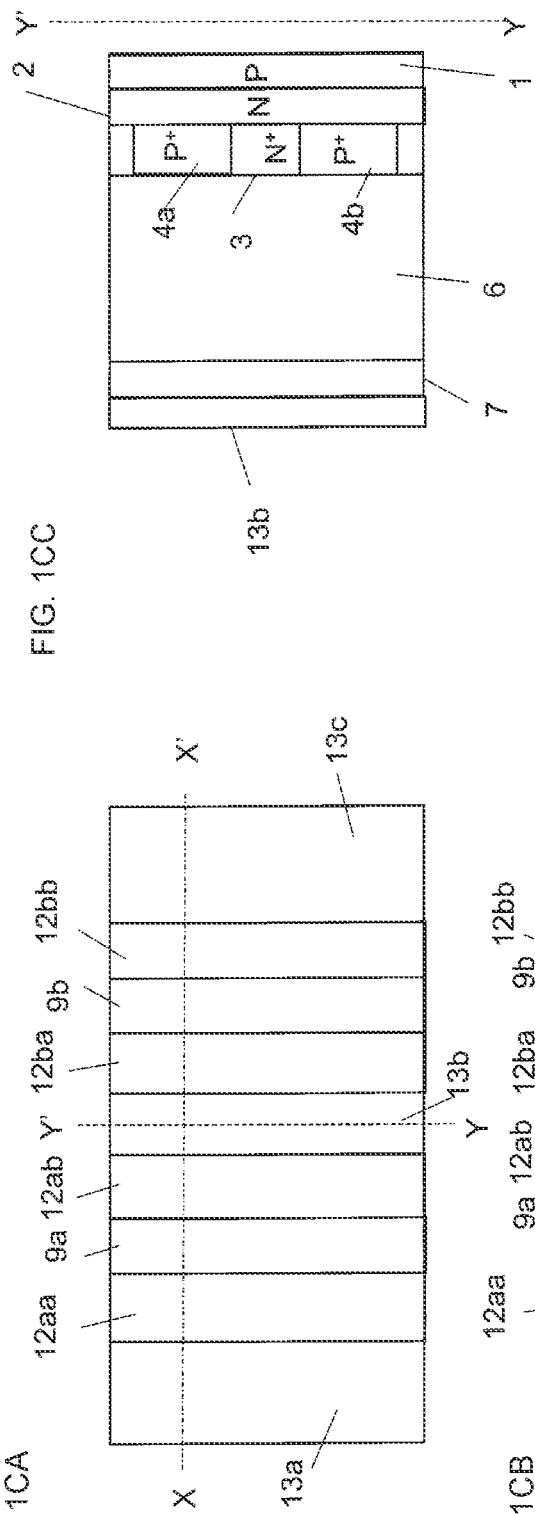
FIG. 1CA
FIG. 1CB

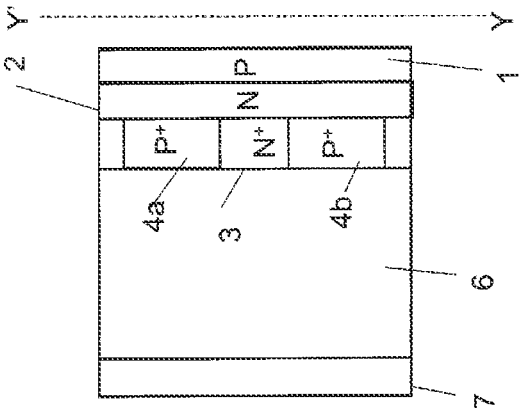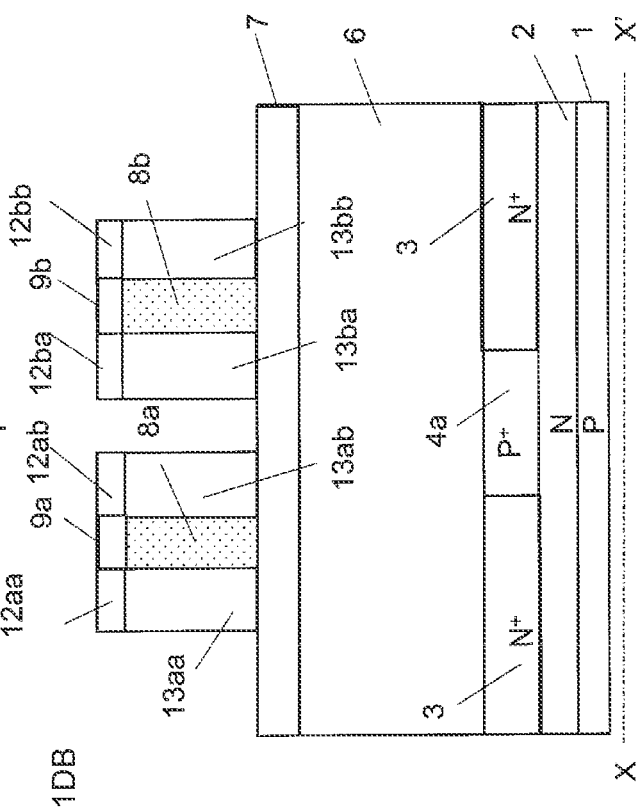

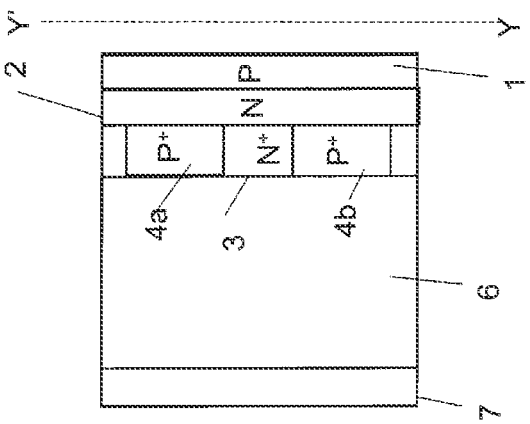
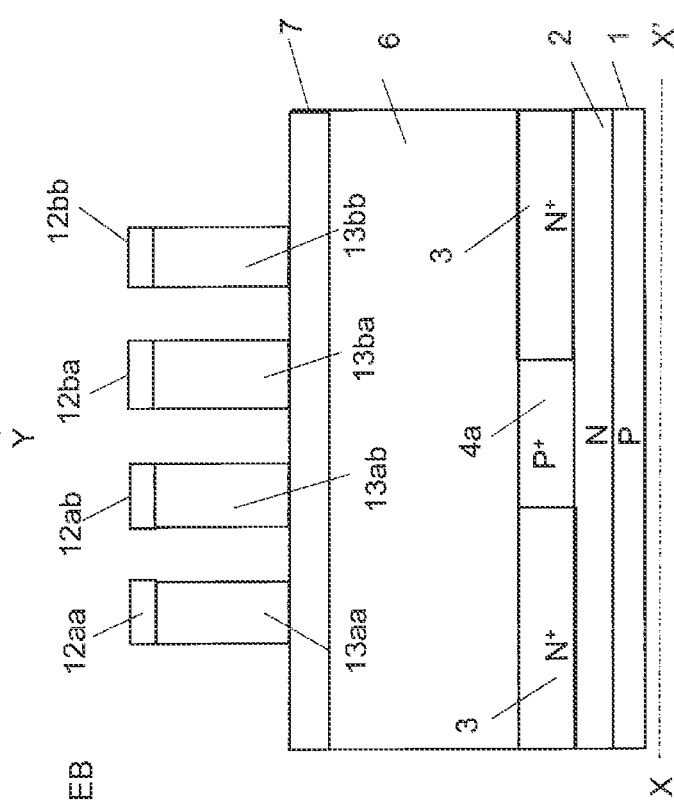
FIG. 1EC
FIG. 1EA
FIG. 1EB

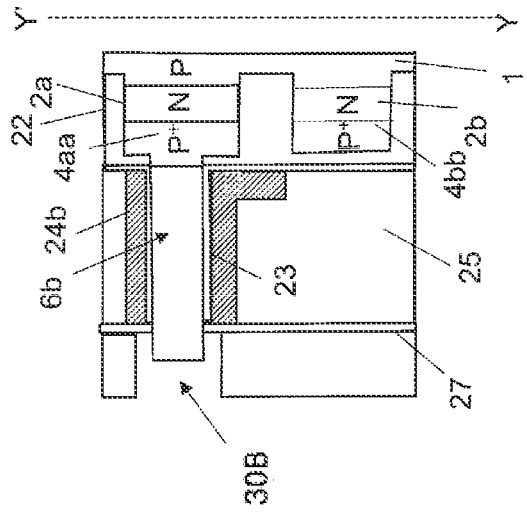
FIG. 1MC
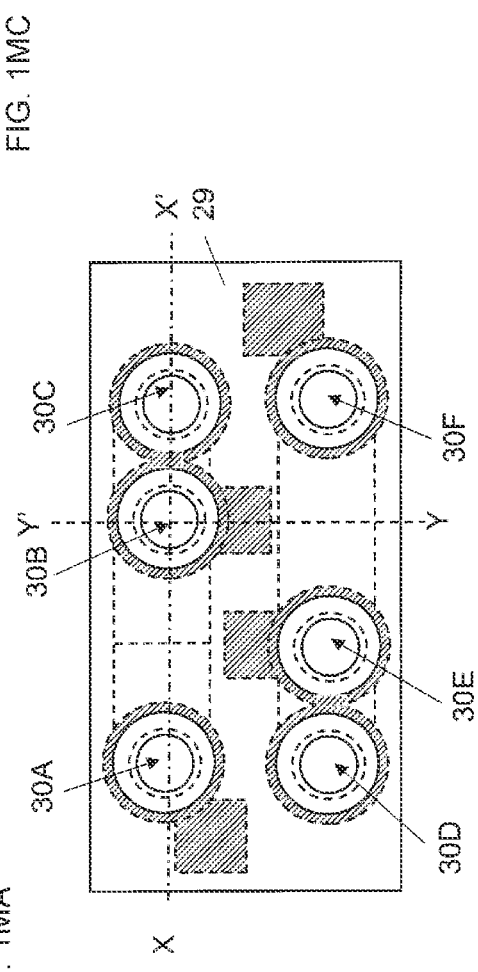
FIG. 1MA
FIG. 1MB

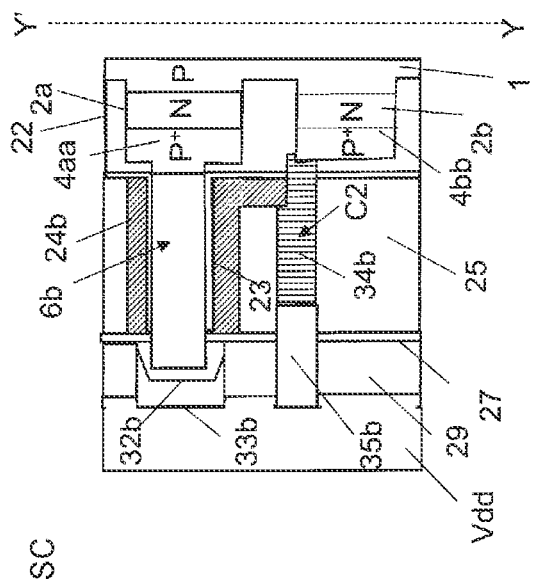
FIG. 1SC
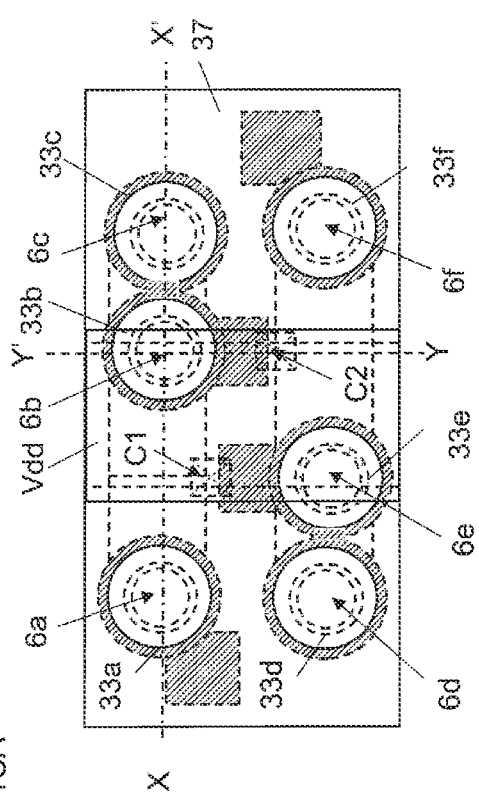
FIG. 1SA
FIG. 1SB

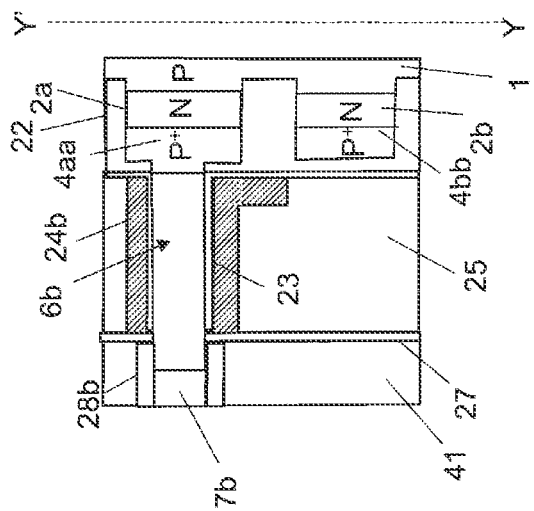
FIG. 2AC
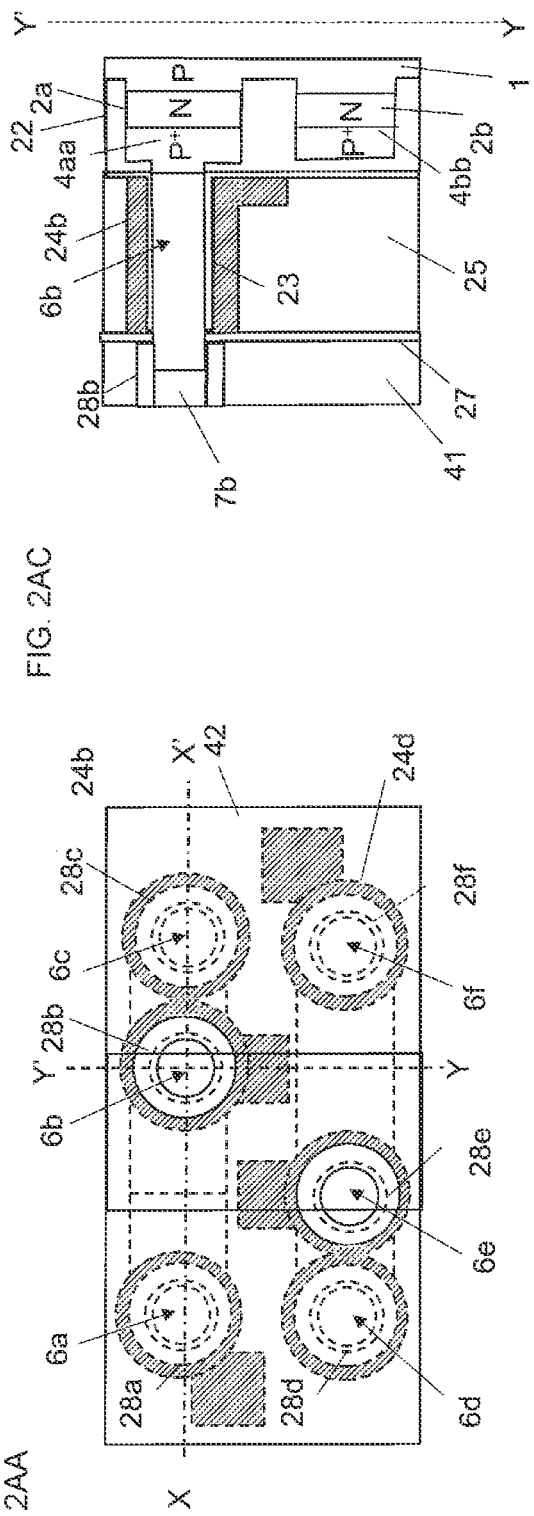
FIG. 2AA
FIG. 2AB
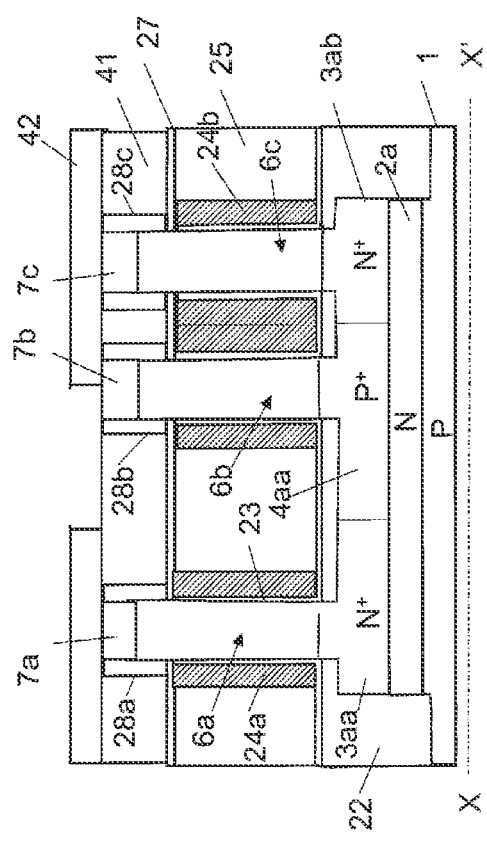

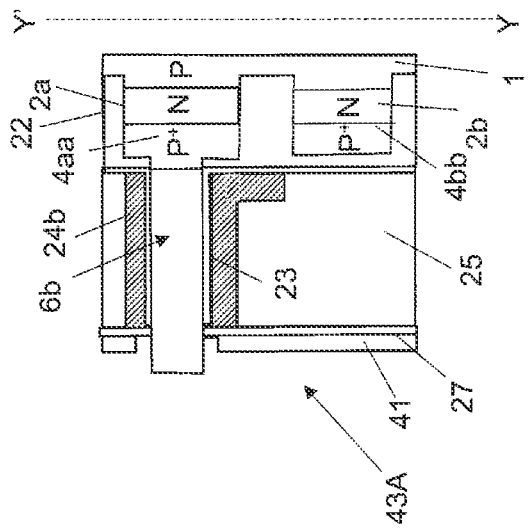
FIG. 2CC
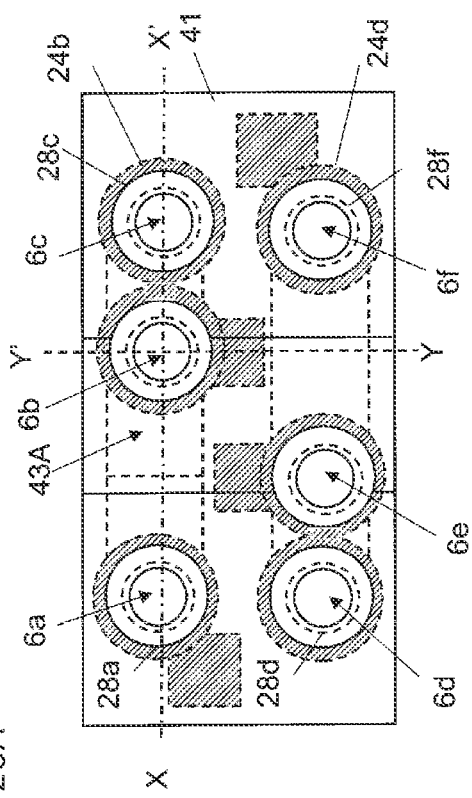
FIG. 2CA
FIG. 2CB

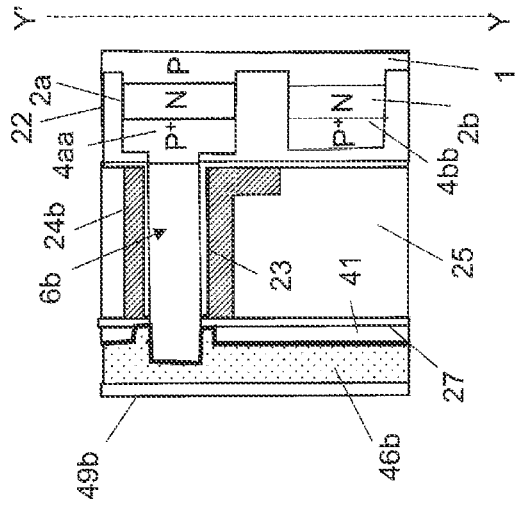
FIG. 2EC
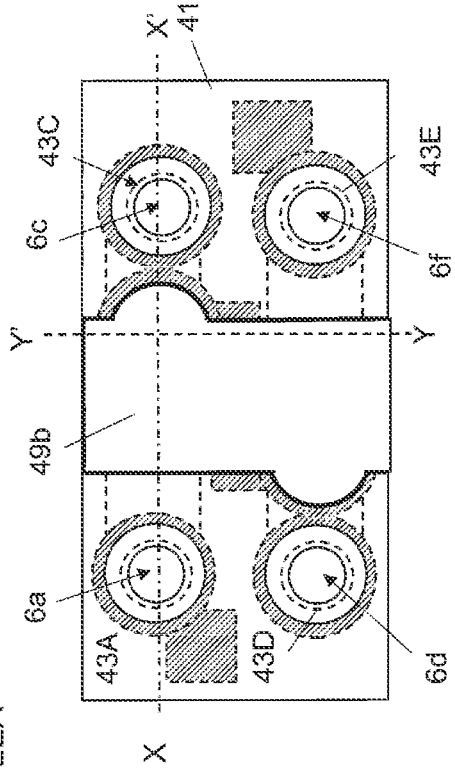
FIG. 2EA
FIG. 2EB

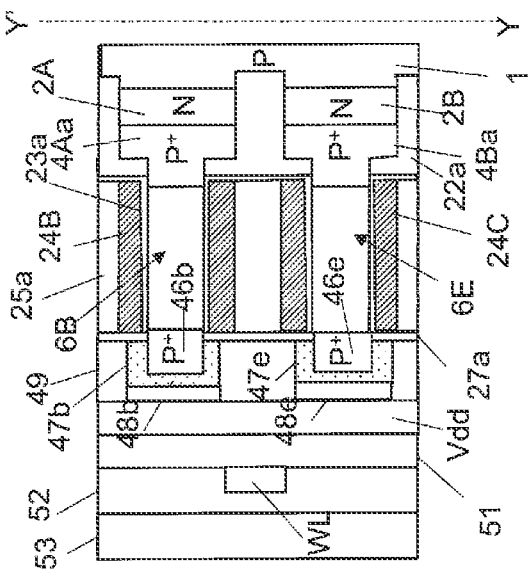
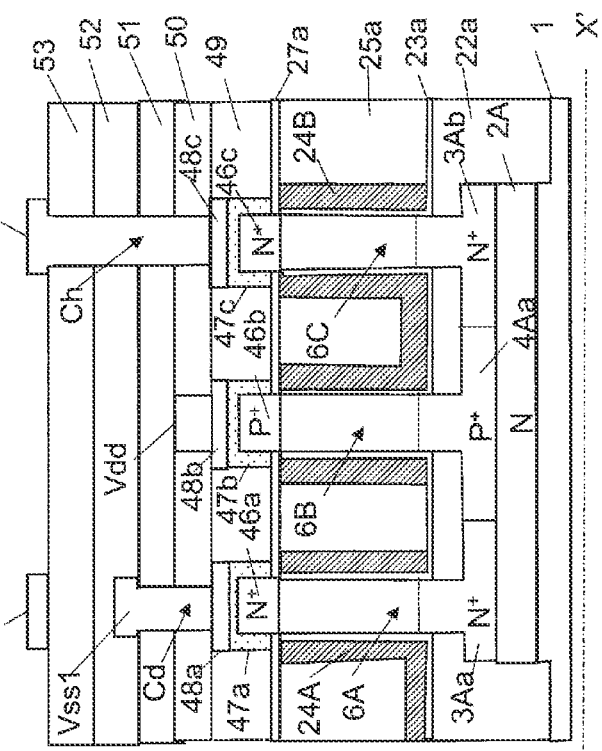
FIG. 3CA
FIG. 3CB
FIG. 3CC

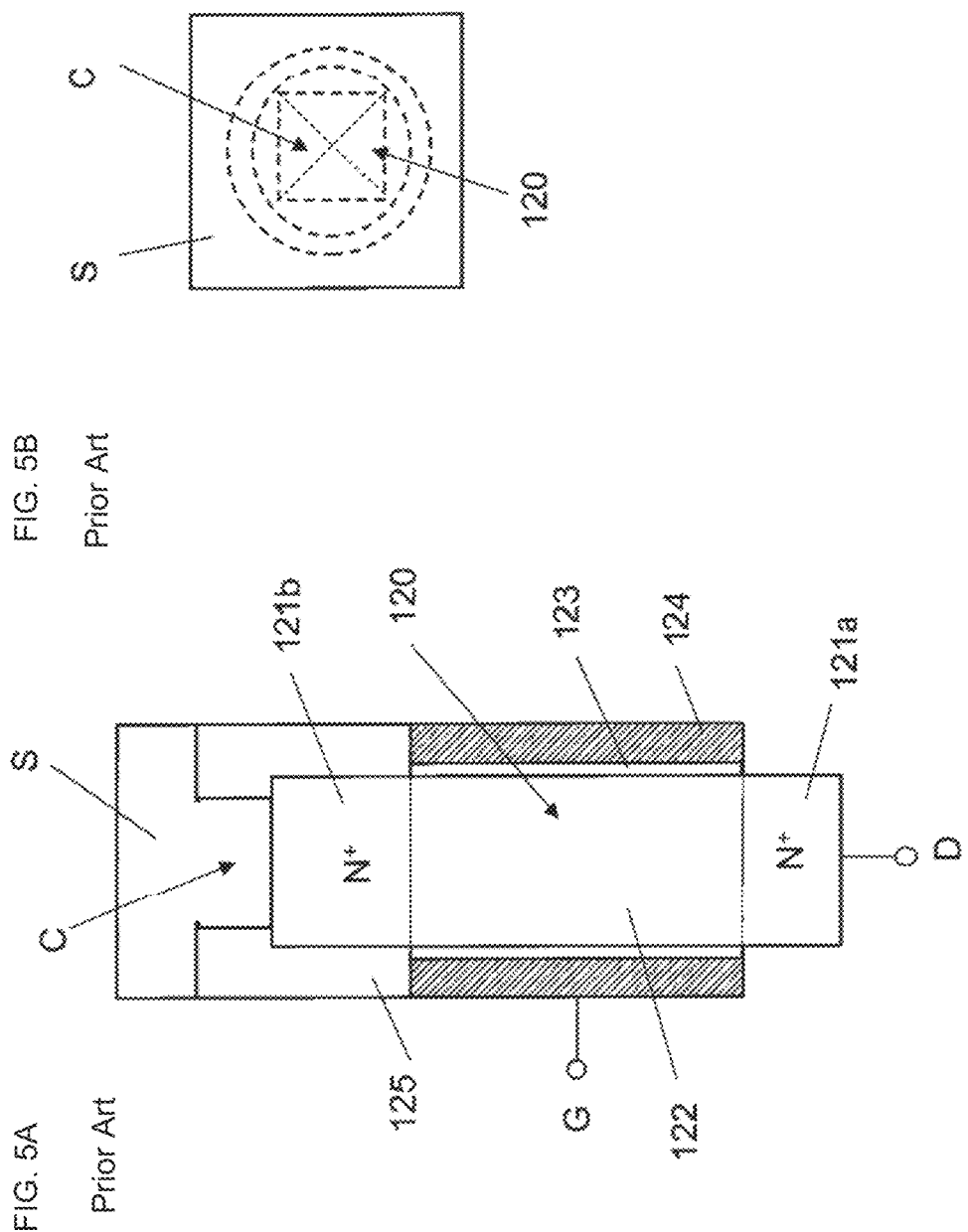

SEMICONDUCTOR MEMORY DEVICE

RELATED APPLICATIONS

The present application is a continuation application of PCT/JP2020/012471, filed Mar. 19, 2020, which claims priority to PCT/JP2019/027541, filed Jul. 11, 2019. The contents of which are incorporated herein by reference in their entirety.

BACKGROUND OF THE INVENTION

1. Field of the Invention

The present invention relates to a pillar-shaped semiconductor device and a method for producing the pillar-shaped semiconductor device.

2. Description of the Related Art

In recent years, three-dimensional transistors have been used for large scale integration (LSI). In such three-dimensional transistors, surrounding gate transistors (SGTs), which are pillar-shaped semiconductor devices, have received attention as semiconductor elements used for highly integrated semiconductor devices. A further increase in the degree of integration and a further improvement in the performance of semiconductor devices including SGTs have been required.

Ordinary planar MOS transistors have a channel that extends in a horizontal direction parallel to the upper surface of a semiconductor substrate. In contrast, SGTs have a channel that extends in a direction perpendicular to the upper surface of a semiconductor substrate (e.g., refer to Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). For this reason, compared with planar MOS transistors, SGTs enable an increase in the density of semiconductor devices.

FIGS. 5A and 5B illustrate a schematic structure of an N-channel SGT. FIG. 5A is a sectional view and FIG. 5B is a plan view. A Si pillar 120 of a P or i (intrinsic) conductivity type (hereafter, silicon semiconductor pillars are referred to as "Si pillars") has, in its upper and lower portions, $N^+$ layers 121a and 121b (hereafter, semiconductor regions containing a donor impurity in a high concentration are referred to as "$N^+$ layers"). When one of the $N^+$ layers 121a and 121b functions as a source, the other functions as a drain. A portion of the Si pillar 120 between the $N^+$ layers 121a and 121b, which function as a source and a drain, functions as a channel region 122. A gate insulating layer 123 is formed so as to surround the channel region 122. A gate conductor layer 124 is formed so as to surround the gate insulating layer 123. The SGT is constituted by the $N^+$ layers 121a and 121b functioning as a source and a drain, the channel region 122, the gate insulating layer 123, and the gate conductor layer 124. The $N^+$ layer 121b and a source wiring metal layer S are connected to each other through a contact hole C formed in an insulating layer 125 on the $N^+$ layer 121b. Thus, in plan view, the area occupied by the SGT corresponds to an area occupied by a single source or drain $N^+$ layer of a planar MOS transistor. Therefore, a further reduction in the size of the chip can be achieved in SGT-including circuit chips compared with circuit chips including a planar MOS transistor.

To further reduce the size of the chip, some problems need to be overcome. As illustrated in FIGS. 5A and 5B, the contact hole C through which the source wiring metal layer S and the $N^+$ layer 121b are connected to each other is formed above the Si pillar 120 in plan view. As the size of the chip is reduced, the distance between the Si pillar 120 and a Si pillar adjacent to the Si pillar 120 is decreased. This decreases the distance between the contact hole C and a contact hole adjacent to the contact hole C in plan view, which requires a reduction in size and an increase in density in a contact hole formation step.

FIG. 6 is a static random access memory (SRAM) cell circuit diagram including SGTs. This SRAM cell circuit includes two inverter circuits. One inverter circuit includes a P-channel SGT_Pc1 serving as a load transistor and an N-channel SGT_Nc1 serving as a drive transistor. The other inverter circuit includes a P-channel SGT_Pc2 serving as a load transistor and an N-channel SGT_Nc2 serving as a drive transistor. The gate of the P-channel SGT_Pc1 and the gate of the N-channel SGT_Nc1 are connected to each other. The drain of the P-channel SGT_Pc2 and the drain of the N-channel SGT_Nc2 are connected to each other. The gate of the P-channel SGT_Pc2 and the gate of the N-channel SGT_Nc2 are connected to each other. The drain of the P-channel SGT_Pc1 and the drain of the N-channel SGT_Nc1 are connected to each other.

As illustrated in FIG. 6, the sources of the P-channel SGTs_Pc1 and Pc2 are connected to a power supply terminal Vdd. The sources of the N-channel SGTs_Nc1 and Nc2 are connected to a ground terminal Vss. Selection N-channel SGTs_SN1 and SN2 are disposed on both sides of the two inverter circuits. The gates of the selection N-channel SGTs_SN1 and SN2 are connected to a word line terminal WLt. The source and drain of the selection N-channel SGT_SN1 are connected to the drains of the N-channel SGT_Nc1 and the P-channel SGT_Pc1 and a bit line terminal BLt, respectively. The source and drain of the selection N-channel SGT_SN2 are connected to the drains of the N-channel SGT_Nc2 and the P-channel SGT_Pc2 and an inverted bit line terminal BLRt, respectively. Thus, the circuit including an SRAM cell is constituted by a total of six SGTs that are two load P-channel SGTs_Pc1 and Pc2, two drive N-channel SGTs_Nc1 and Nc2, and two selection SGTs SN1 and SN2 (e.g., refer to U.S. Patent Application Publication No. 2010/0219483). In this SRAM cell, Si pillars of the two load P-channel SGTs_Pc1 and Pc2 are formed so as to be closest to each other. In this case, the formation of contact holes on the $P^+$ layers in upper portions of the load P-channel SGTs_Pc1 and Pc2 poses a problem in terms of increase in the degree of integration of SRAM cells.

SUMMARY OF THE INVENTION

An increase in the performance and the degree of integration of circuits including SGTs is demanded.

According to a first aspect of the present invention, a method for producing a pillar-shaped semiconductor device including a semiconductor pillar that stands on a substrate in a vertical direction, a gate insulating layer that surrounds the semiconductor pillar, and a gate conductor layer that surrounds the gate insulating layer includes: a step of forming a first semiconductor pillar that serves as the semiconductor pillar and includes a first material layer at a top portion thereof and a second semiconductor pillar that is adjacent to the first semiconductor pillar, serves as the semiconductor pillar, and includes a second material layer at a top portion thereof; a step of forming a first interlayer insulating layer above an upper surface of the gate conductor layer and at outer peripheries of the top portions of the first semiconductor pillar and the second semiconductor pillar; a step of forming, on the first interlayer insulating layer, a third material layer that surrounds a side surface of the top portion of the first semiconductor pillar and a fourth material layer that surrounds a side surface of the top portion of the second semiconductor pillar; a step of forming a second interlayer insulating layer at outer peripheries in contact with side surfaces of the third material layer and the fourth material layer; a step of removing the first material layer, the second material layer, the third material layer, and the fourth material layer to form a first recessed portion that surrounds the top portion of the first semiconductor pillar and a second recessed portion that surrounds the top portion of the second semiconductor pillar; a step of forming, in the first recessed portion, a first impurity layer that surrounds the top portion of the first semiconductor pillar; a step of forming, in the second recessed portion, a second impurity layer that surrounds the top portion of the second semiconductor pillar; a step of forming a first conductor layer on the first impurity layer and in the first recessed portion; a step of forming a second conductor layer on the second impurity layer and in the second recessed portion; and a step of forming a first wiring conductor layer that connects the first conductor layer and the second conductor layer, wherein a semiconductor pillar that serves as the semiconductor pillar and is different from the first semiconductor pillar and the second semiconductor pillar is not formed in plan view in a region in which the first wiring conductor layer is formed.

The method may further include: step of forming a third interlayer insulating layer on the first conductor layer, the second conductor layer, and the second interlayer insulating layer; a step of forming, in the third interlayer insulating layer, a first band-shaped contact hole that partly overlaps and contacts a region of the first conductor layer and a region of the second conductor layer in plan view; and a step of forming the first wiring conductor layer such that the first band-shaped contact hole is filled with the first wiring conductor layer, wherein regions of the first conductor layer and the second conductor layer may partly protrude outward from the first band-shaped contact hole in plan view.

The method may further include: a step of forming, after formation of the second interlayer insulating layer, a first mask material layer that partly overlaps, in a connected manner, a region of the first material layer and the third material layer and a region of the second material layer and the fourth material layer in plan view and that has an opening; a step of etching the first material layer, the third material layer, the second material layer, the fourth material layer, and the second interlayer insulating layer using the first mask material layer as a mask to form a third recessed portion; a step of forming, in the third recessed portion, a third impurity layer connected to the first impurity layer and the second impurity layer upon formation of the first impurity layer and the second impurity layer; a step of forming a third conductor layer on the first impurity layer, the second impurity layer, and the third impurity layer and in the third recessed portion; and a step of forming the first wiring conductor layer connected to the third conductor layer, wherein the first band-shaped contact hole may be present inside the third conductor layer in plan view, and the first impurity layer, the second impurity layer, and the third impurity layer may be formed of the same semiconductor material layer.

The third conductor layer may be the first wiring conductor layer.

The first impurity layer and the second impurity layer may be formed by epitaxial growth.

The method may further include: a step of forming a single crystal semiconductor thin film layer on bottom surfaces of the first recessed portion and the second recessed portion; and then, a step of forming the first impurity layer and the second impurity layer in the first recessed portion and the second recessed portion.

A load surrounding gate transistor (SGT) of a static random access memory (SRAM) cell circuit may be formed in the first semiconductor pillar and the second semiconductor pillar.

According to a second aspect of the present invention, a pillar-shaped semiconductor device includes: a first semiconductor pillar that stands on a substrate in a vertical direction; a second semiconductor pillar that stands adjacent to the first semiconductor pillar; a gate insulating layer that has an upper surface positioned lower than upper surfaces of top portions of the first semiconductor pillar and the second semiconductor pillar and that surrounds the first semiconductor pillar and the second semiconductor pillar; a gate conductor layer that surrounds the gate insulating layer; a first interlayer insulating layer on the gate conductor layer; a first impurity layer which covers the top portion of the first semiconductor pillar and whose outer periphery is equally spaced with an outer periphery of the first semiconductor pillar in plan view; a second impurity layer which covers the top portion of the second semiconductor pillar and whose outer periphery is equally spaced with an outer periphery of the second semiconductor pillar in plan view; a first conductor layer on the first impurity layer; a second conductor layer on the second impurity layer; a second interlayer insulating layer at outer peripheries of the first impurity layer, the second impurity layer, the first conductor layer, and the second conductor layer; a third interlayer insulating layer on the first conductor layer, the second conductor layer, and the second interlayer insulating layer; a first band-shaped contact hole that is present in the third interlayer insulating layer and that partly overlaps and contacts a region of the first conductor layer and a region of the second conductor layer in plan view; and a first wiring conductor layer with which the first band-shaped contact hole is filled, wherein regions of the first conductor layer and the second conductor layer partly protrude outward from the first band-shaped contact hole in plan view.

The pillar-shaped semiconductor device may further include: a third impurity layer that is present on the same surface together with the first impurity layer and the second impurity layer and that is connected to the first impurity layer and the second impurity layer; a third conductor layer that is present on the first impurity layer, the second impurity layer, and the third impurity layer and that has the same shape as the first impurity layer, the second impurity layer, and the third impurity layer in plan view; and the first wiring conductor layer connected to the third conductor layer, wherein the first band-shaped contact hole may be present inside the third conductor layer in plan view.

The third conductor layer may be the first wiring conductor layer.

The first impurity layer and the second impurity layer may be semiconductor material layers formed by epitaxial growth.

The pillar-shaped semiconductor device may include a single crystal semiconductor thin film layer on side surfaces and bottoms of the first impurity layer and the second impurity layer.

The pillar-shaped semiconductor device may include a load surrounding gate transistor (SGT) of a static random access memory (SRAM) cell circuit, the load surrounding gate transistor being disposed in the first semiconductor pillar and the second semiconductor pillar.

BRIEF DESCRIPTION OF THE DRAWINGS

FIGS. 1BA to 1BC are a plan view and sectional structural views for describing a method for producing a pillar-shaped semiconductor device including SGTs according to a first embodiment.

FIGS. 1CA to 1CC are a plan view and sectional structural views for describing a method for producing a pillar-shaped semiconductor device including SGTs according to a first embodiment.

FIGS. 1DA to 1DC are a plan view and sectional structural views for describing a method for producing a pillar-shaped semiconductor device including SGTs according to a first embodiment.

FIGS. 1EA to 1EC are a plan view and sectional structural views for describing a method for producing a pillar-shaped semiconductor device including SGTs according to a first embodiment.

FIGS. 1MA to 1MC are a plan view and sectional structural views for describing a method for producing a pillar-shaped semiconductor device including SGTs according to a first embodiment.

FIGS. 1OA to 1OC are a plan view and sectional structural views for describing a method for producing a pillar-shaped semiconductor device including SGTs according to a first embodiment.

FIGS. 1SA to 1SC are a plan view and sectional structural views for describing a method for producing a pillar-shaped semiconductor device including SGTs according to a first embodiment.

FIGS. 2AA to 2AC are a plan view and sectional structural views for describing a method for producing a pillar-shaped semiconductor device including SGTs according to a second embodiment of the present invention.

FIGS. 2CA to 2CC are a plan view and sectional structural views for describing a method for producing a pillar-shaped semiconductor device including SGTs according to a second embodiment of the present invention.

FIGS. 2EA to 2EC are a plan view and sectional structural views for describing a method for producing a pillar-shaped semiconductor device including SGTs according to a second embodiment of the present invention.

FIGS. 3CA to 3CC are a plan view and sectional structural views for describing a method for producing a pillar-shaped semiconductor device including SGTs according to a third embodiment of the present invention.

FIGS. 5A and 5B are schematic structural views illustrating an SGT in the related art.

DETAILED DESCRIPTION OF THE PREFERRED EMBODIMENTS

Hereafter, a method for producing a pillar-shaped semiconductor device according to embodiments of the present invention will be described with reference to the attached drawings.

First Embodiment

Hereafter, a method for producing an SRAM cell circuit including SGTs according to a first embodiment of the present invention will be described with reference to FIG. 1AA to FIG. 1TC. Among FIG. 1AA to FIG. 1TC, figures suffixed with A are plan views, figures suffixed with B are sectional structural views taken along lines X-X' in the corresponding figures suffixed with A, and figures suffixed with C are sectional structural views taken along lines Y-Y' in the corresponding figures suffixed with A.

Figure 1A:
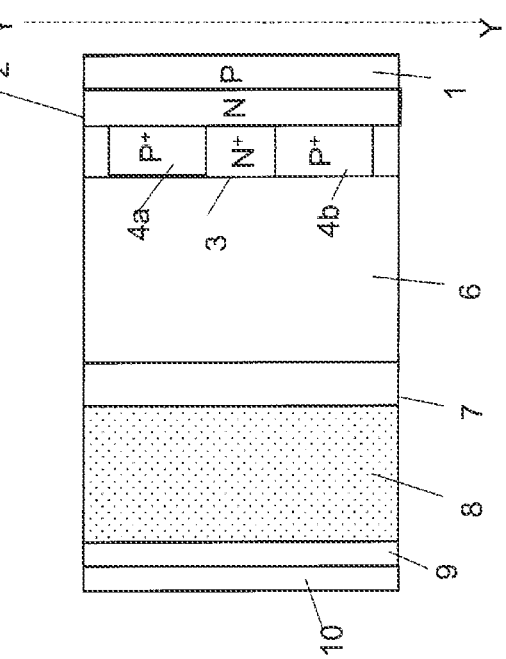
FIGS. 1AA to 1AC are a plan view and sectional structural views for describing a method for producing a pillar-shaped semiconductor device including SGTs according to a first embodiment.
Figure 1A:
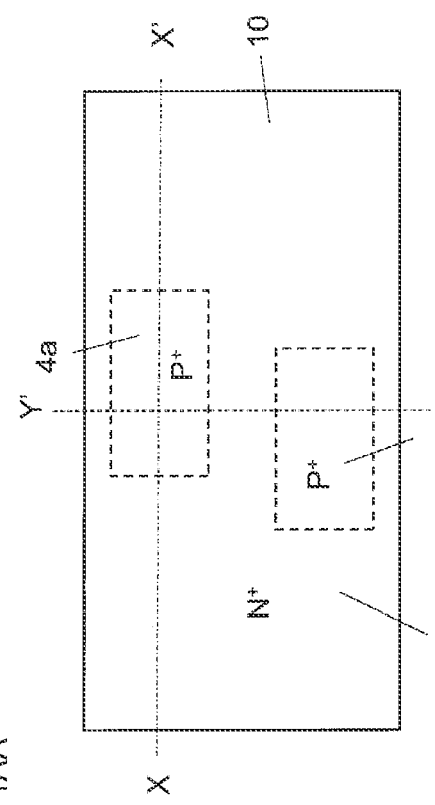
Figure 1A:
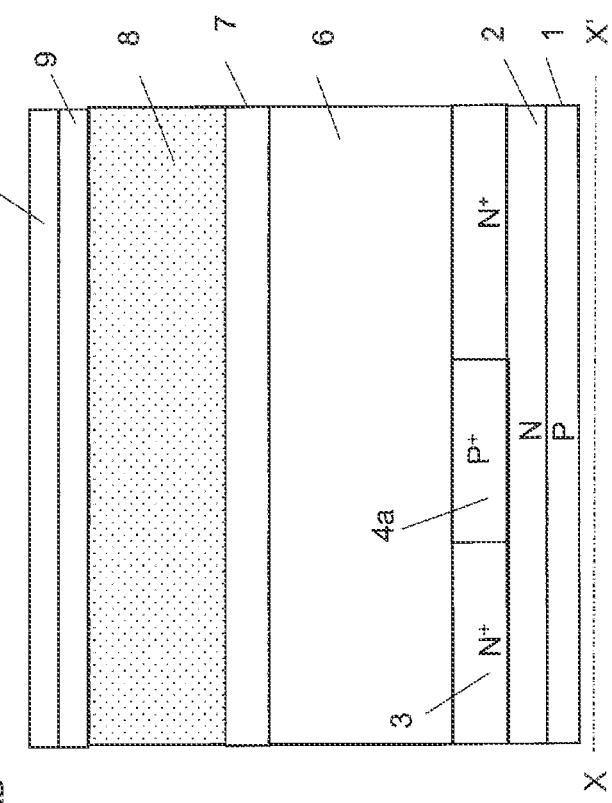

As illustrated in FIGS. 1AA to 1AC, an N layer 2 is formed on a P layer substrate 1 (one example of a "substrate" in Claims) by epitaxial growth. An $N^+$ layer 3 and $P^+$ layers 4a and 4b are formed in a top layer of the N layer 2 by ion implantation. Then, an i layer 6 is formed. A mask material layer 7 formed of, for example, a $SiO_2$ layer, an aluminum oxide ($Al_2O_3$, also referred to as AlO) layer, and a $SiO_2$ layer is formed. A silicon germanium (SiGe) layer 8 is deposited. A mask material layer 9 formed of a $SiO_2$ layer is deposited. A mask material layer 10 formed of a SiN layer is deposited. The i layer 6 may be formed of N-type or P-type Si containing donor or acceptor impurity atoms in a small amount.

Next, the mask material layer 10 is etched using, as a mask, a band-shaped resist layer (not illustrated) that is formed by lithography so as to extend in a Y direction in plan view. Thus, a band-shaped mask material layer (not illustrated) that extends in the Y direction in plan view is formed. The band-shaped mask material layer is subjected to isotropic etching using a resist layer as a mask so as to have a width smaller than that of the resist layer. Thus, band-shaped mask material layers 10a and 10b each having a width smaller than the minimum width of the resist layer that can be formed by lithography are formed. The mask material layer 9 is etched by, for example, reactive ion etching (RIE) using the band-shaped mask material layers 10a and 10b as etching masks to form band-shaped mask material layers 9a and 9b. Each section of the band-shaped mask material layers 10a and 10b formed by isotropic etching has a trapezoidal shape in which the bottom has a larger width than the top whereas each section of the band-shaped mask material layers 9a and 9b has a rectangular shape because of RIE. This rectangular section leads to an improvement in the precision of an etching pattern formed using the band-shaped mask material layers 9a and 9b as masks. Then, the SiGe layer 8 is etched by, for example, RIE using the band-shaped mask material layers 9a and 9b as masks to form band-shaped SiGe layers 8a and 8b as illustrated in FIGS. 1BA to 1BC. The band-shaped mask material layers 10a and 10b on the band-shaped mask material layers 9a and 9b may be removed before etching of the SiGe layer 8 or may be left.

Next, a SiN layer (not illustrated) is entirely formed by atomic layered deposition (ALD) so as to cover the mask material layer 7, the band-shaped SiGe layers 8a and 8b, and the band-shaped mask material layers 9a and 9b. In this case, the section of the SiN layer is rounded at the top. The rounded portions are desirably formed at positions higher than those of the band-shaped SiGe layers 8a and 8b. A $SiO_2$ layer (not illustrated) is entirely deposited by, for example, flow chemical vapor deposition (flow CVD). The $SiO_2$ layer and the SiN layer are polished by chemical mechanical polishing (CMP) so as to have upper surfaces that are flush with those of the band-shaped mask material layers 9a and 9b. Thus, SiN layers 13a, 13b, and 13c are formed. The top portions of the SiN layers 13a, 13b, and 13c are etched to form recessed portions. This etching is performed such that the bottoms of the recessed portions are positioned lower than the band-shaped mask material layers 9a and 9b. A SiN layer (not illustrated) is entirely deposited, and the SiN layer is entirely polished by CMP so as to have an upper surface that is flush with those of the mask material layers 9a and 9b. The $SiO_2$ layer formed by flow CVD is removed. Thus, as illustrated in FIGS. 1CA to 1CC, band-shaped mask material layers 12aa, 12ab, 12ba, and 12bb having the same shape as the top portions of the SiN layers 13a, 13b, and 13c in plan view are formed on both sides of the band-shaped mask material layers 9a and 9b.

Next, as illustrated in FIGS. 1DA to 1DC, the SiN layers 13a, 13b, and 13c are etched using the band-shaped mask material layers 9a, 9b, 12aa, 12ab, 12ba, and 12bb as masks to form band-shaped SiN layers 13aa, 13ab, 13ba, and 13bb. In this case, the band-shaped SiN layers 13aa, 13ab, 13ba, and 13bb have the same width in plan view.

Next, the band-shaped mask material layers 9a and 9b and the band-shaped SiGe layers 8a and 8b are removed. Thus, as illustrated in FIGS. 1EA to 1EC, the band-shaped SiN layers 13aa, 13ab, 13ba, and 13bb on which the band-shaped mask material layers 12aa, 12ab, 12ba, and 12bb are formed and which extend in the Y direction so as to be parallel with each other in plan view are formed on the mask material layer 7.

Figure 1F:
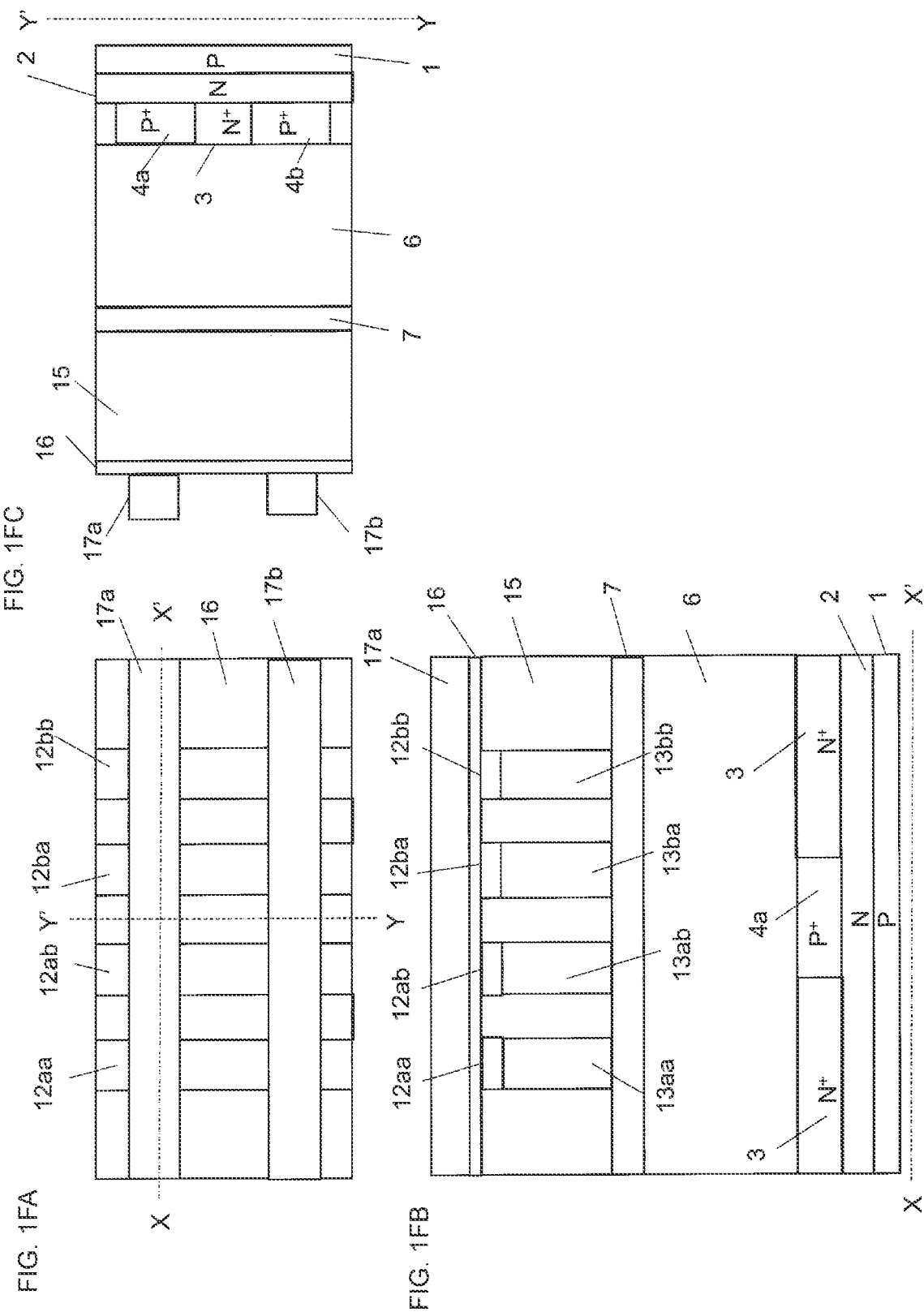
FIGS. 1FA to 1FC are a plan view and sectional structural views for describing a method for producing a pillar-shaped semiconductor device including SGTs according to a first embodiment.

Next, a $SiO_2$ layer (not illustrated) is entirely deposited by flow CVD. The $SiO_2$ layer is polished by CMP so as to have an upper surface that is flush with those of the band-shaped mask material layers 12aa, 12ab, 12ba, and 12bb. Thus, as illustrated in FIGS. 1FA to 1FC, a $SiO_2$ layer 15 is formed. A SiN layer 16 is formed on the $SiO_2$ layer 15 and the band-shaped mask material layers 12aa, 12ab, 12ba, and 12bb. Band-shaped mask material layers 17a and 17b that extend in an X direction so as to be parallel with each other are formed on the SiN layer 16 by the same fundamental method as that for forming the band-shaped SiN layers 13aa, 13ab, 13ba, and 13bb.

Figure 1G:
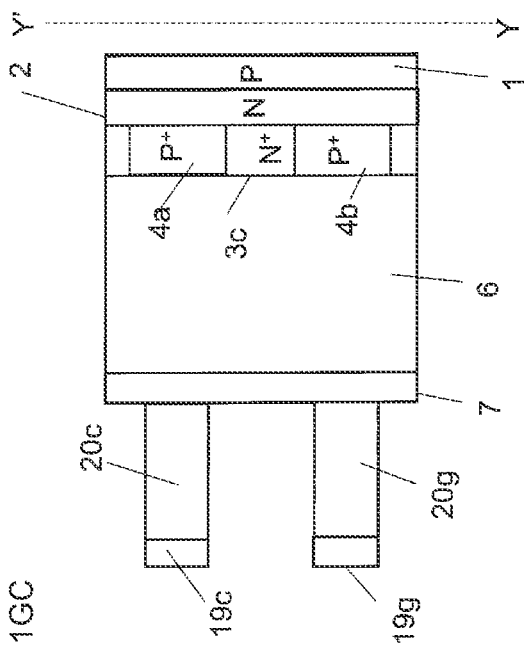
FIGS. 1GA to 1GC are a plan view and sectional structural views for describing a method for producing a pillar-shaped semiconductor device including SGTs according to a first embodiment.
Figure 1G:
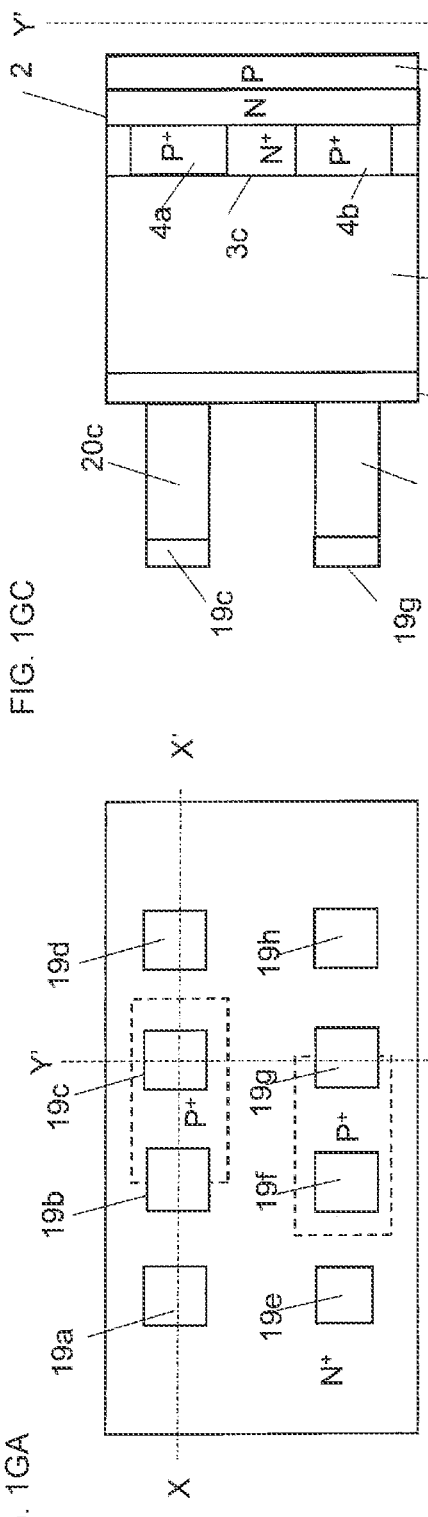
Figure 1G:
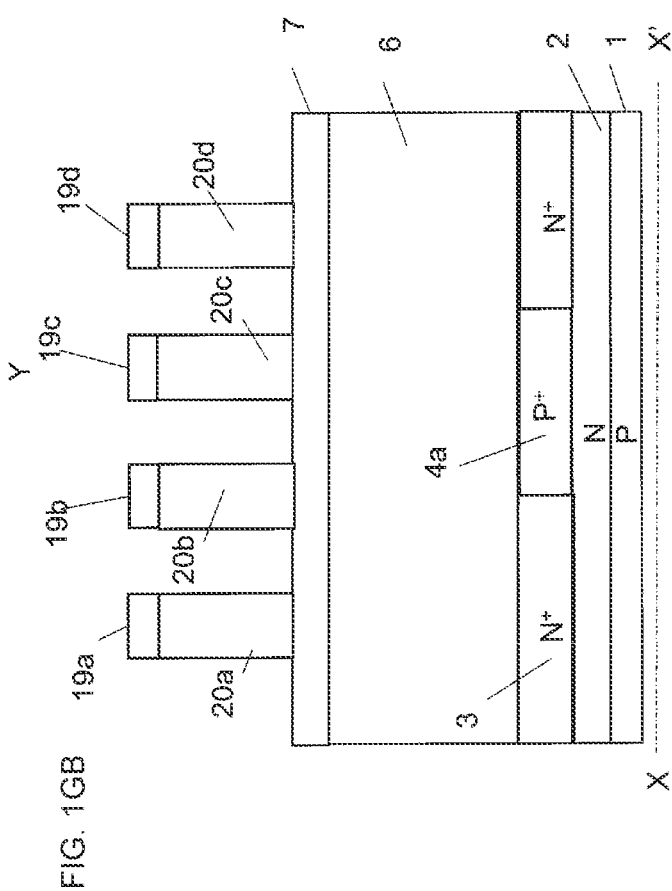

Next, as illustrated in FIGS. 1GA to 1GC, the SiN layer 16, the band-shaped mask material layers 12aa, 12ab, 12ba, and 12bb, the band-shaped SiN layers 13aa, 13ab, 13ba, and 13bb, and the mask material layer 7 are etched by RIE using the band-shaped mask material layers 17a and 17b as masks. The remaining SiN layer 16 and $SiO_2$ layer 15 are removed. This results in formation of SiN pillars 20a, 20b, 20c, 20d, 20e, 20f, 20g, and 20h on which mask material layers 19a, 19b, 19c, 19d, 19e, 19f, 19g, and 19h each having a rectangular shape in plan view are formed.

Figure 1H:
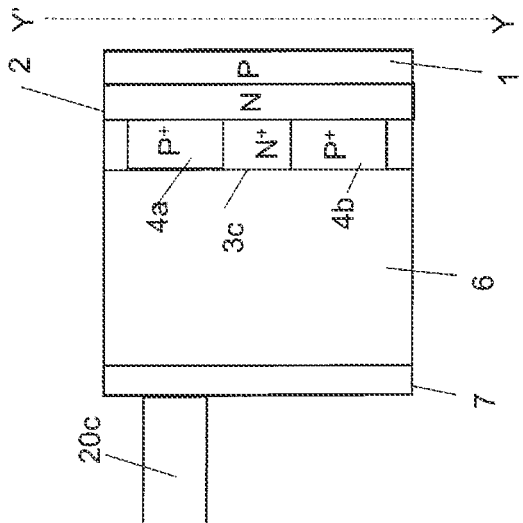
FIGS. 1HA to 1HC are a plan view and sectional structural views for describing a method for producing a pillar-shaped semiconductor device including SGTs according to a first embodiment.
Figure 1H:
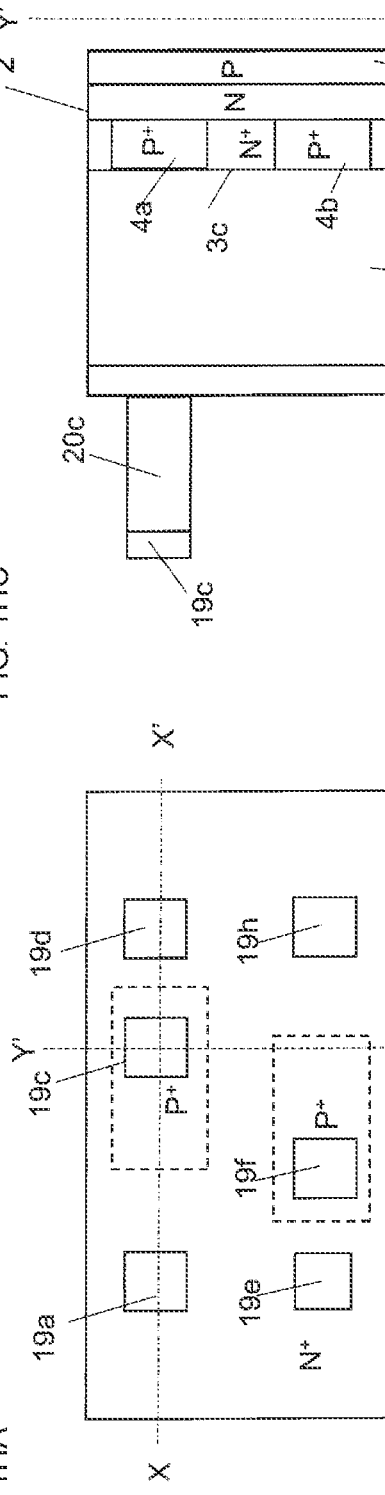
Figure 1H:
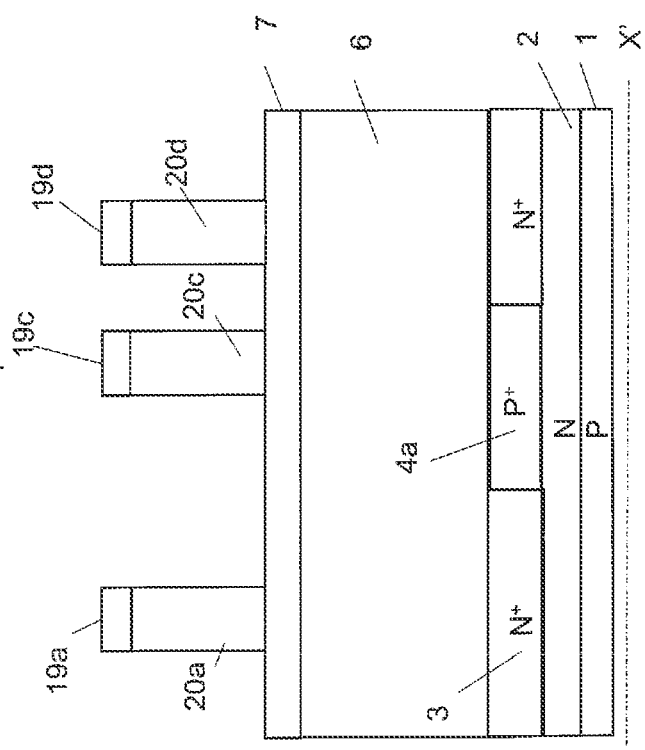

Next, as illustrated in FIGS. 1HA to 1HC, the rectangular mask material layers 19b and 19g and the SiN pillars 20b and 20g are removed.

Figure 1I:
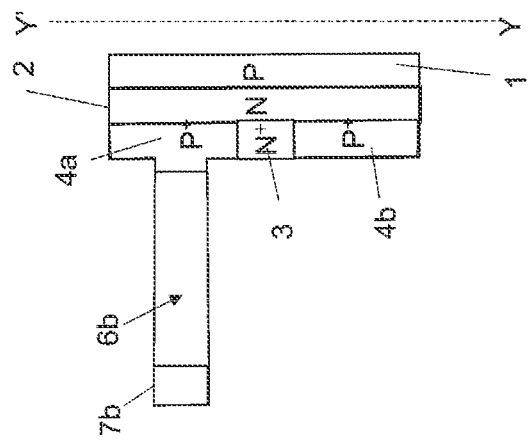
FIGS. 1IA to 1IC are a plan view and sectional structural views for describing a method for producing a pillar-shaped semiconductor device including SGTs according to a first embodiment.
Figure 1I:
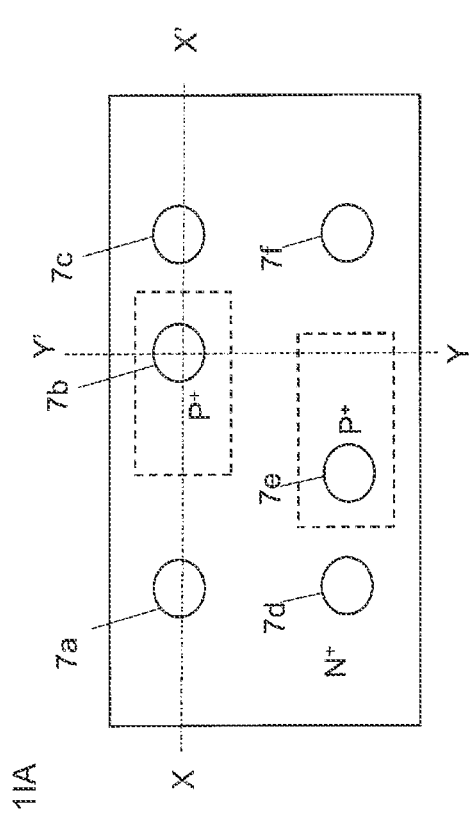
Figure 1I:
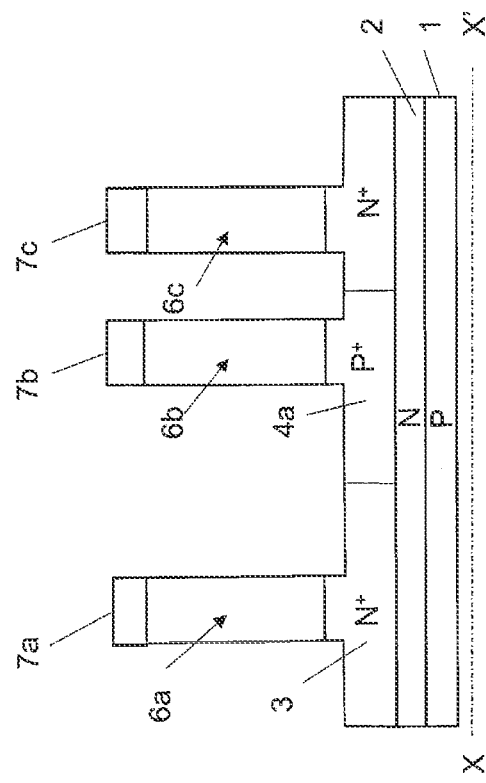

Next, the mask material layer 7 is etched using the mask material layers 19a, 19c, 19d, 19e, 19f, and 19h and the SiN pillars 20a, 20c, 20d, 20e, 20f, and 20h as masks to form mask material layers 7a, 7b (one example of a "first material layer" in Claims), 7c, 7d, 7e (one example of a "second material layer" in Claims), and 7f as illustrated in FIGS. 1IA to 1IC. Herein, isotropic etching is performed by, for example, chemical dry etching (CDE) such that the mask material layers 7a, 7b, 7c, 7d, 7e, and 7f each have a circular shape in plan view. This CDE is not performed when the mask material layers 7a, 7b, 7c, 7d, 7e, and 7f each have a circular shape in plan view before this process. The mask material layers 19a, 19c, 19d, 19e, 19f, and 19h and the SiN pillars 20a, 20c, 20d, 20e, 20f, and 20h are removed. The i layer 6 is etched using the mask material layers 7a, 7b, 7c, 7d, 7e, and 7f as masks to form Si pillars 6a, 6b (one example of a "first semiconductor pillar" in Claims), 6c, 6d, 6e (one example of a "second semiconductor pillar" in Claims), and 6f on the $N^+$ layer 3 and the $P^+$ layers 4a and 4b.

Figure 1J:
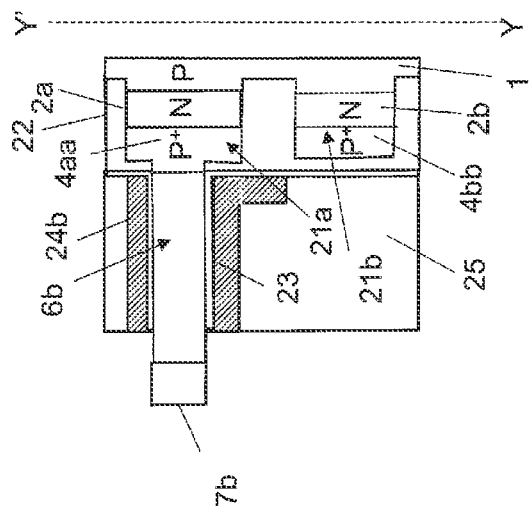
FIGS. 1JA to 1JC are a plan view and sectional structural views for describing a method for producing a pillar-shaped semiconductor device including SGTs according to a first embodiment.
Figure 1J:
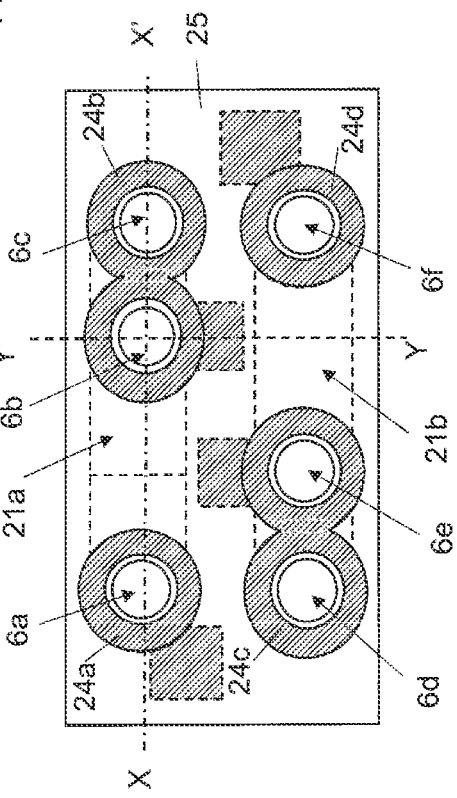
Figure 1J:
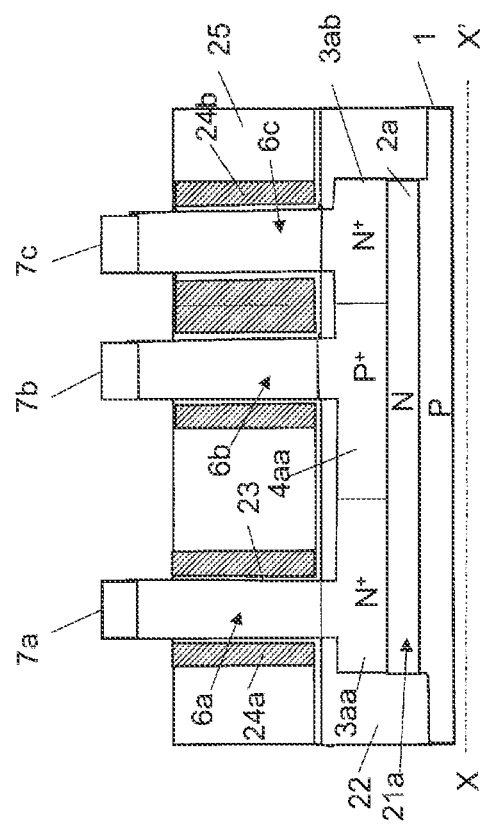

Next, as illustrated in FIGS. 1JA to 1JC, the $N^+$ layer 3, the $P^+$ layer 4a, the N layer 2, and the P layer substrate 1 connected to the bottom portions of the Si pillars 6a, 6b, and 6c are etched to form a Si pillar base 21a constituted by an upper portion of the P layer substrate 1, the N layer 2a, the $N^+$ layers 3aa and 3ab, and the $P^+$ layer 4aa. At the same time, the $N^+$ layer 3, the $P^+$ layer 4b, the N layer 2, and the P layer substrate 1 connected to the bottom portions of the Si pillars 6d, 6e, and 6f are etched to form a Si pillar base 21b constituted by an upper portion of the P layer substrate 1, the N layer 2b, the $N^+$ layers 3ba (not illustrated) and 3bb (not illustrated), and the $P^+$ layer 4bb. A $SiO_2$ layer 22 is formed on the P layer substrate 1 and at the outer peripheries of the $N^+$ layers 3aa, 3ab, 3ba, and 3bb, the $P^+$ layers 4aa and 4bb, and the N layers 2a and 2b. A $HfO_2$ layer 23 (one example of a "gate insulating layer" in Claims) and TiN layers (not illustrated) are entirely deposited by ALD. In this case, the side surfaces of the TiN layers are in contact with each other between the Si pillars 6b and 6c and between the Si pillars 6d and 6e. A TiN layer 24a is formed on the $HfO_2$ layer 23 that surrounds the outer periphery of the Si pillar 6a, a TiN layer 24b (one example of a "gate conductor layer" in Claims) is formed so as to surround the $HfO_2$ layer 23 at the outer peripheries of the Si pillars 6b and 6c, a TiN layer 24c (one example of a "gate conductor layer" in Claims) is formed so as to surround the $HfO_2$ layer 23 at the outer peripheries of the Si pillars 6d and 6e, and a TiN layer 24d is formed so as to surround the $HfO_2$ layer 23 at the outer periphery of the Si pillar 6f. A $SiO_2$ layer (not illustrated) is entirely deposited and then entirely polished by CMP so as to have an upper surface that is flush with those of the mask material layers 7a, 7b, 7c, 7d, 7e, and 7f. The $SiO_2$ layer (not illustrated) planarized by RIE is etched back to form a $SiO_2$ layer 25. Top portions of the $HfO_2$ layer 23 and the TiN layers 24a, 24b, 24c, and 24d are removed using the mask material layers 7a, 7b, 7c, 7d, 7e, and 7f and the $SiO_2$ layer 25 as masks. The TiN layers 24a, 24b, 24c, and 24d serve as gate conductor layers of SGTs. The gate conductor layers are layers that contribute to setting of the threshold voltage of an SGT and may be formed of a gate conductor layer having a single-layer structure or a multilayer structure. The gate conductor layers are formed in contact with the entire side surfaces between the Si pillars 6b and 6c and between the Si pillars 6d and 6e. Herein, for example, a tungsten (W) layer is formed so as to be connected to the TiN layers 24a, 24b, 24c, and 24d, and the W layer may also be used as a gate conductor layer. The W layer may be another conductor material layer.

Figure 1K:
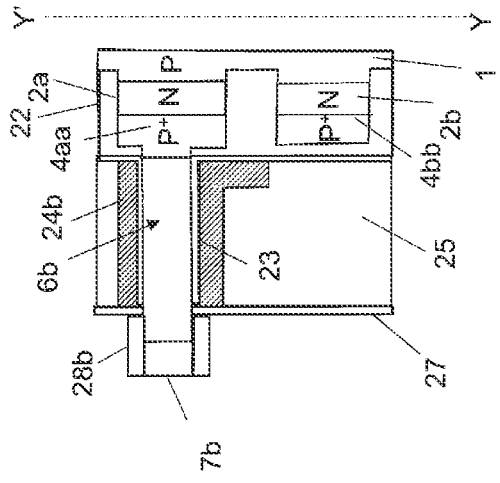
FIGS. 1KA to 1KC are a plan view and sectional structural views for describing a method for producing a pillar-shaped semiconductor device including SGTs according to a first embodiment.
Figure 1K:
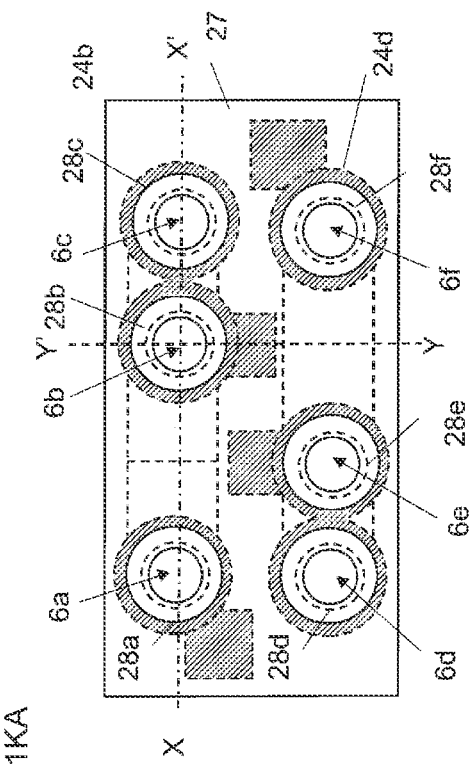
Figure 1K:
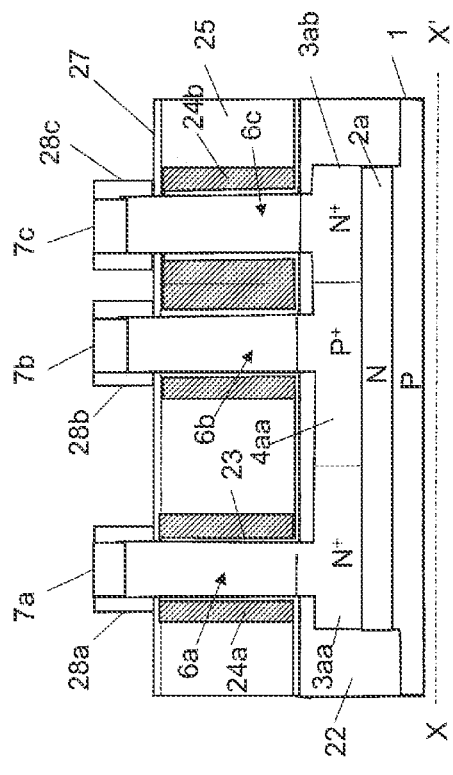

Next, as illustrated in FIGS. 1KA to 1KC, a SiN layer 27 (one example of a "first interlayer insulating layer" in Claims) is formed on the $SiO_2$ layer 25 formed at the outer peripheries of the Si pillars 6a to 6f. A $SiO_2$ layer (not illustrated) is entirely deposited. The $SiO_2$ layer is etched by RIE to form $SiO_2$ layers 28a, 28b (one example of a "third material layer" in Claims), 28c, 28d, 28e (one example of a "fourth material layer" in Claims), and 28f with an equal width in plan view on the side surfaces of the exposed top portions of the Si pillars 6a to 6f and the mask material layers 7a to 7f. In this case, the $SiO_2$ layer 28b and the $SiO_2$ layer 28c are formed apart from each other. Similarly, the $SiO_2$ layer 28d and the $SiO_2$ layer 28e are formed apart from each other. It is sufficient that the SiN layer 27 is formed at least on the TiN layers 24a, 24b, 24c, and 24d serving as gate conductor layers.

Figure 1L:
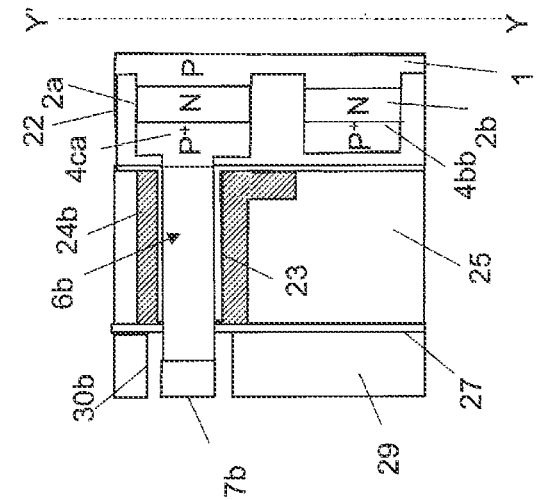
FIGS. 1LA to 1LC are a plan view and sectional structural views for describing a method for producing a pillar-shaped semiconductor device including SGTs according to a first embodiment.
Figure 1L:
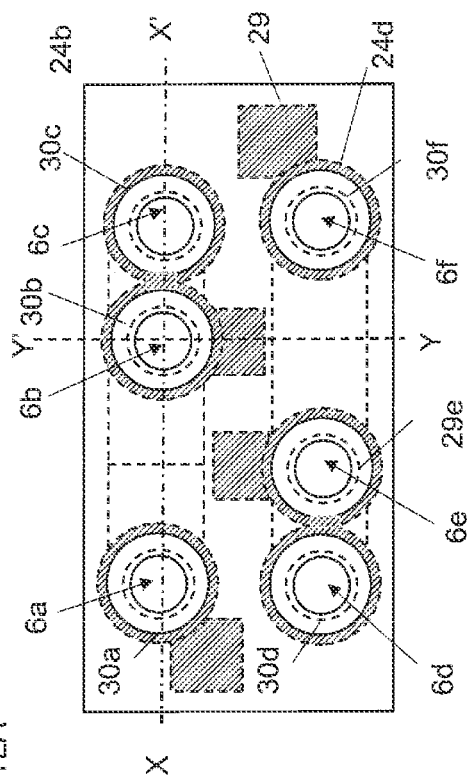
Figure 1L:
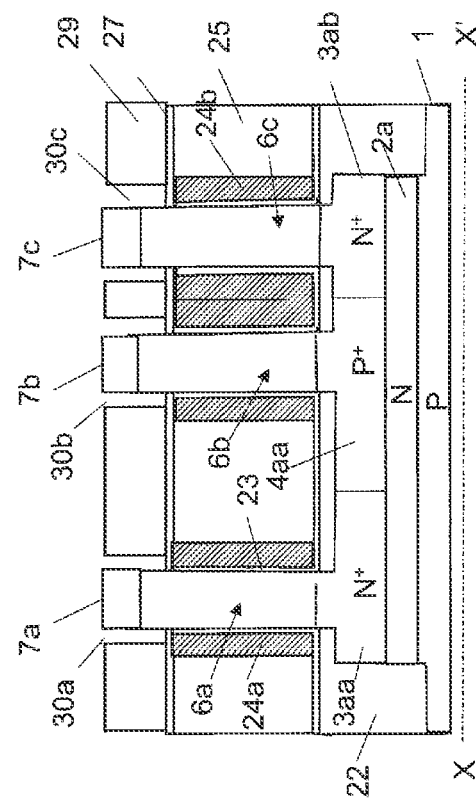

Next, an aluminum oxide ($Al_2O_3$) layer (not illustrated) is entirely deposited. As illustrated in FIGS. 1LA to 1LC, the $Al_2O_3$ layer is polished by CMP so as to have an upper surface that is flush with those of the mask material layers 7a to 7f. Thus, an $Al_2O_3$ layer 29 (one example of a "second interlayer insulating layer" in Claims) is formed. The $SiO_2$ layers 28a, 28b, 28c, 28d, 28e, and 28f that surround the top portions of the Si pillars 6a to 6f are removed to form recessed portions 30a, 30b, 30c, 30d, 30e, and 30f that surround the top portions of the Si pillars 6a to 6f. Since the $SiO_2$ layers 28a, 28b, 28c, 28d, 28e, and 28f are formed in a self-aligned manner with the Si pillars 6a to 6f, the recessed portions 30a, 30b, 30c, 30d, 30e, and 30f are formed in a self-aligned manner with the Si pillars 6a to 6f.

Next, as illustrated in FIGS. 1MA to 1MC, the mask material layers 7a, 7b, 7c, 7d, 7e, and 7f are removed to form recessed portions 30A, 30B (one example of a "first recessed portion" in Claims), 30C, 30D, 30E (one example of a "second recessed portion" in Claims), and 30F around and on the top portions of the Si pillars 6a to 6f.

Figure 1N:
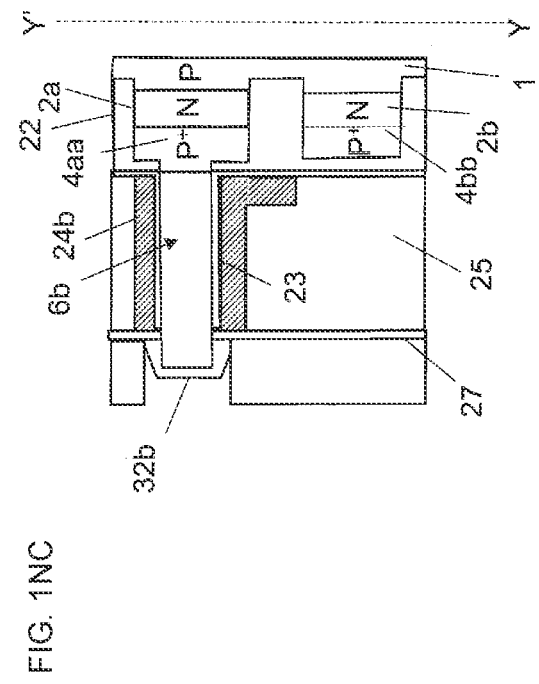
FIGS. 1NA to 1NC are a plan view and sectional structural views for describing a method for producing a pillar-shaped semiconductor device including SGTs according to a first embodiment.
Figure 1N:
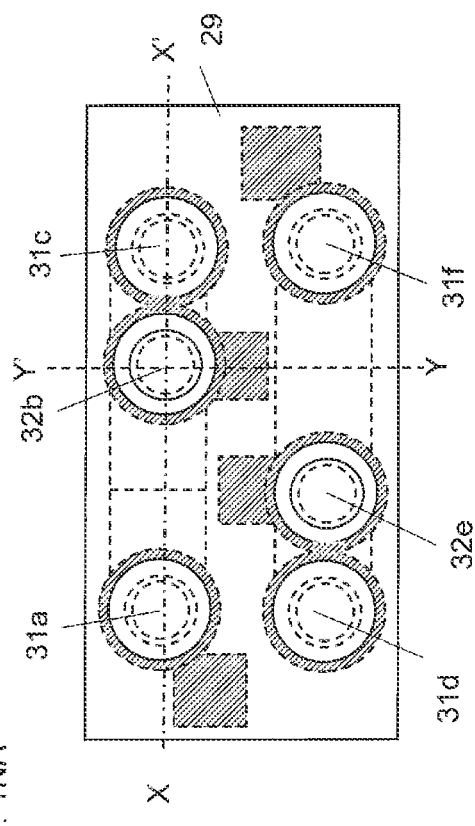
Figure 1N:
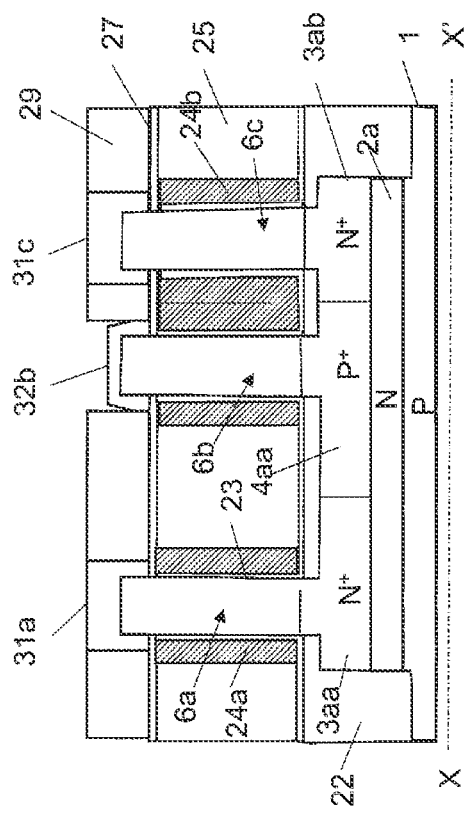
Figure 10C:
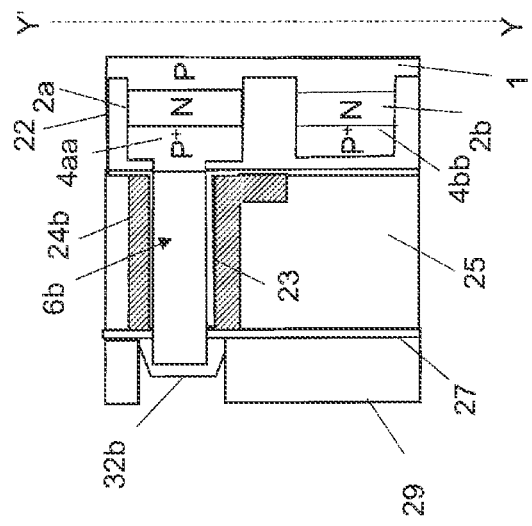
Figure 10A:
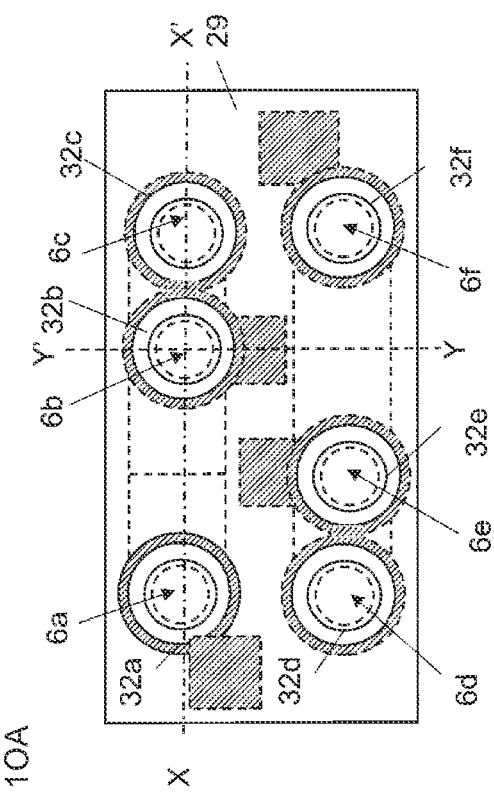
Figure 10B:
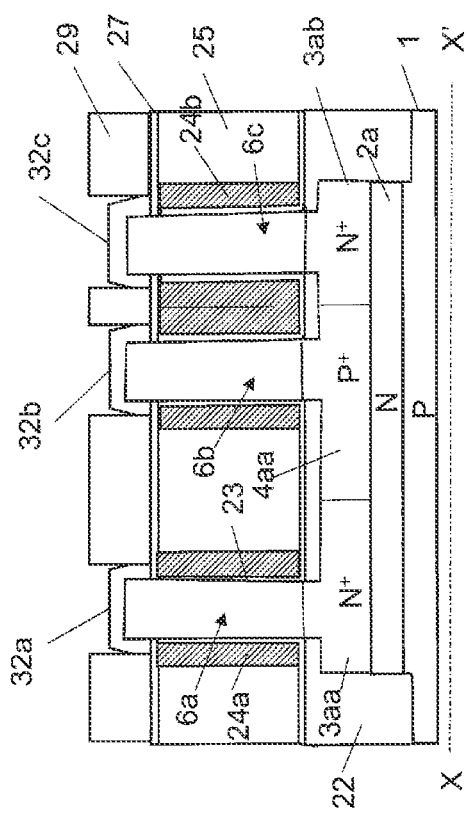

Next, a $SiO_2$ layer (not illustrated) is entirely deposited by CVD. As illustrated in FIGS. 1NA to 1NC, the $SiO_2$ layer is polished by CMP until the upper surface of the $SiO_2$ layer reaches the upper surface of the $Al_2O_3$ layer 29. Thus, $SiO_2$ layers 31a, 31b (not illustrated), 31c, 31d, 31e (not illustrated), and 31f are formed in the recessed portions 30A, 30B, 30C, 30D, 30E, and 30F so as to cover the top portions of the Si pillars 6a to 6f. The $SiO_2$ layers 31b and 31e are removed by lithography and chemical etching. A $P^+$ layer 32b (one example of a "first impurity layer" in Claims) and a $P^+$ layer 32e (one example of a "second impurity layer" in Claims) containing acceptor impurities are formed by selective epitaxial growth in the recessed portions 30B and 30E so as to cover the top portions of the Si pillars 6b and 6e. The $P^+$ layers 32b and 32e are formed such that the outer peripheries of the $P^+$ layers 32b and 32e are present inside the outer peripheries of the recessed portions 30B and 30E in plan view. Herein, before formation of the $P^+$ layers 32b and 32e, damaged surface layers in the top portions of the Si pillars 6b and 6e are desirably removed and cleaned by thinly oxidizing the top portions of the Si pillars 6b and 6e and then removing the oxide films. For the $P^+$ layers 32b and 32e, single crystal $P^+$ layers 32b and 32e may be formed by a method other than the selective epitaxial growth, such as molecular beam epitaxy. Alternatively, the $P^+$ layers 32b and 32e may be formed by entirely depositing a semiconductor layer containing acceptor impurities, polishing the semiconductor layer by CMP until the upper surface reaches the upper surface of the $Al_2O_3$ layer 29, and then performing CDE or chemical etching on the upper surface.

Next, a $SiO_2$ layer (not illustrated) is entirely deposited. The $SiO_2$ layer is polished by CMP so as to have an upper surface that is flush with that of the $Al_2O_3$ layer 29. Thus, the $SiO_2$ layer (not illustrated) covers the $P^+$ layers 32b and 32e. The $SiO_2$ layers 31a, 31c, 31d, and 31f are removed by lithography and chemical etching. As illustrated in FIGS. 1OA to 1OC, $N^+$ layers 32a, 32c, 32d, and 32f containing donor impurities are formed by selective epitaxial growth in the recessed portions 30A, 30C, 30D, and 30F so as to cover the top portions of the Si pillars 6a, 6c, 6d, and 6f. The $N^+$ layers 32a, 32c, 32d, and 32f are formed such that the outer peripheries of the $N^+$ layers 32a, 32c, 32d, and 32f are present inside the outer peripheries of the recessed portions 30A, 30C, 30D, and 30F in plan view. The $SiO_2$ layer on the $P^+$ layers 32b and 32e is removed.

Figure 1P:
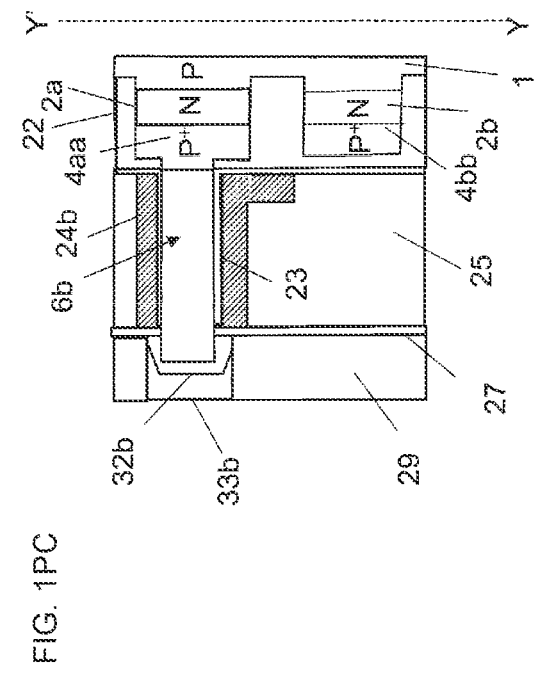
FIGS. 1PA to 1PC are a plan view and sectional structural views for describing a method for producing a pillar-shaped semiconductor device including SGTs according to a first embodiment.
Figure 1P:
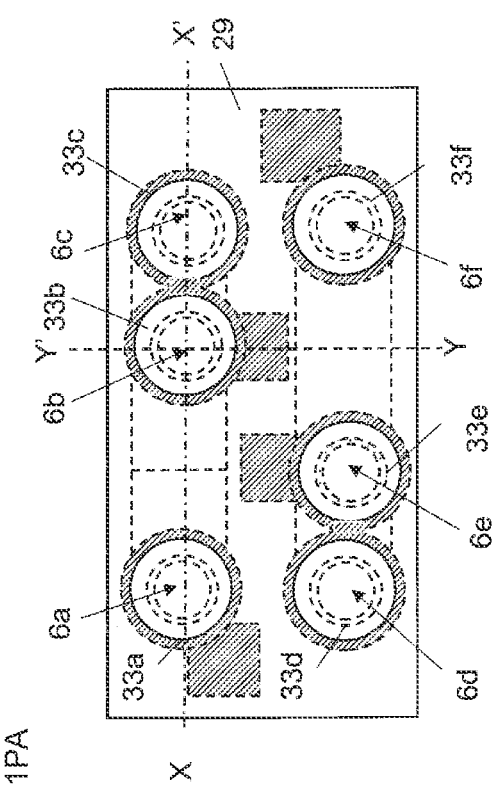
Figure 1P:
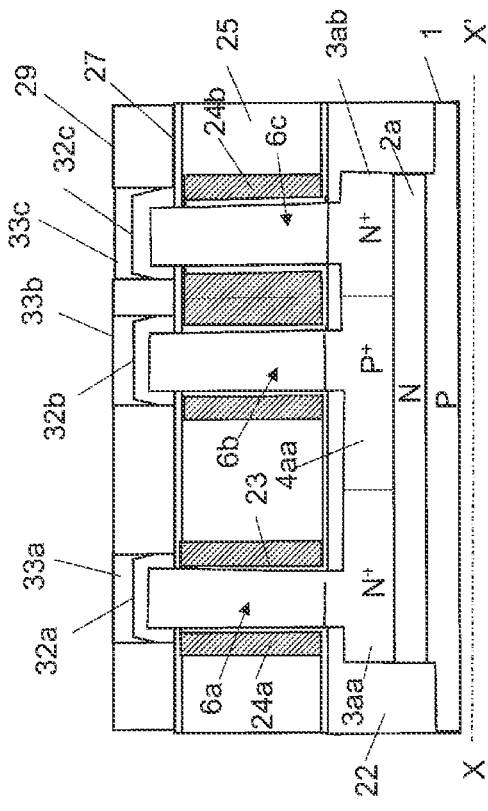

Next, a thin Ta layer (not illustrated) and a W layer (not illustrated) are entirely deposited. As illustrated in FIGS. 1PA to 1PC, the W layer is polished by CMP so as to have an upper surface that is flush with that of the $Al_2O_3$ layer 29 to form W layers 33a, 33b (one example of a "first conductor layer" in Claims), 33c, 33d, 33e (one example of a "second conductor layer" in Claims), and 33f each having the Ta layer on the side surface and bottom thereof. In this case, the Ta layer present between the $N^+$ layers 32a, 32c, 32d, and 32f and the $P^+$ layers 32b and 32e, and the W layers 33a, 33b, 33c, 33d, 33e, and 33f is a buffer layer for decreasing the contact resistance between the two layers. The buffer layer may be another material layer having a single-layer structure or a multilayer structure.

Figure 1Q:
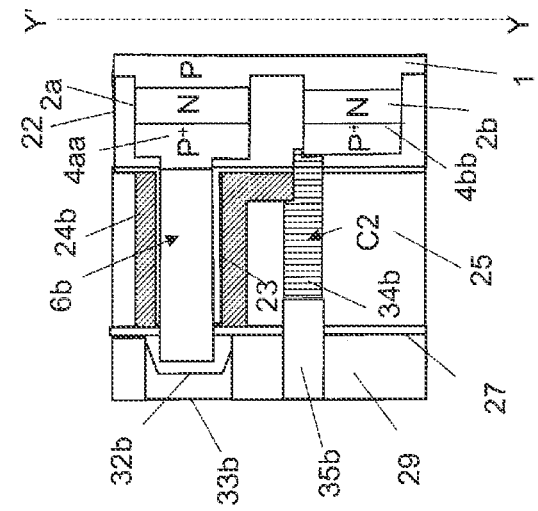
FIGS. 1QA to 1QC are a plan view and sectional structural views for describing a method for producing a pillar-shaped semiconductor device including SGTs according to a first embodiment.
Figure 1Q:
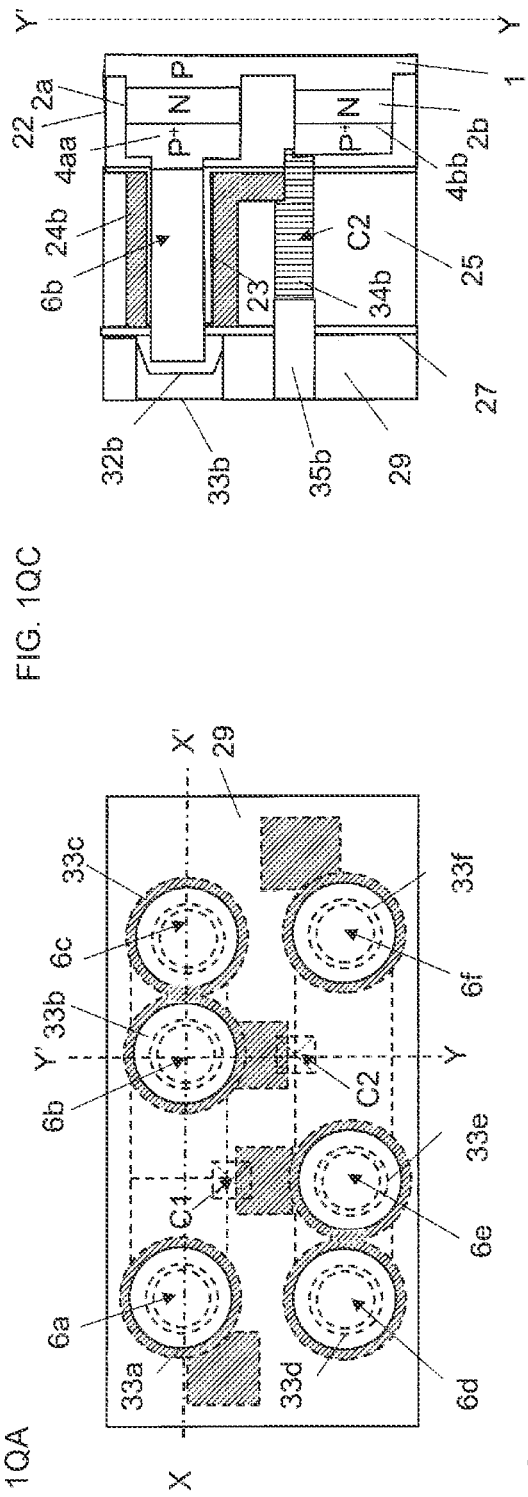
Figure 1Q:
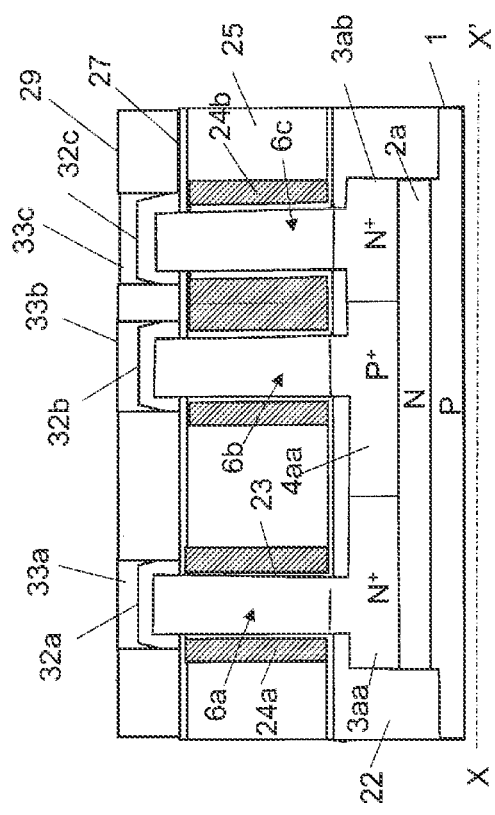

Next, as illustrated in FIG. 1QA to 1QC, a contact hole C1 is formed on the TiN layer 24c, the $N^+$ layer 3aa, and the $P^+$ layer 4aa. At the same time, a contact hole C2 is formed on the TiN layer 24b, the $N^+$ layer 3bb, and the $P^+$ layer 4bb. A thin buffer Ti layer (not illustrated) and a W layer (not illustrated) are entirely deposited. The W layer is etched back by RIE so as to have an upper surface positioned lower than the upper surfaces of the contact holes C1 and C2. Thus, W layers 34a (not illustrated) and 34b are formed in the contact holes C1 and C2. A SiN layer (not illustrated) is entirely deposited. The SiN layer is polished by CMP so as to have an upper surface that is flush with those of the W layers 33a, 33b, 33c, 33d, and 33f. Thus, SiN layers 35a (not illustrated) and 35b are formed on the W layer 34a in the contact hole C1 and on the W layer 34b in the contact hole C2, respectively.

Figure 1R:
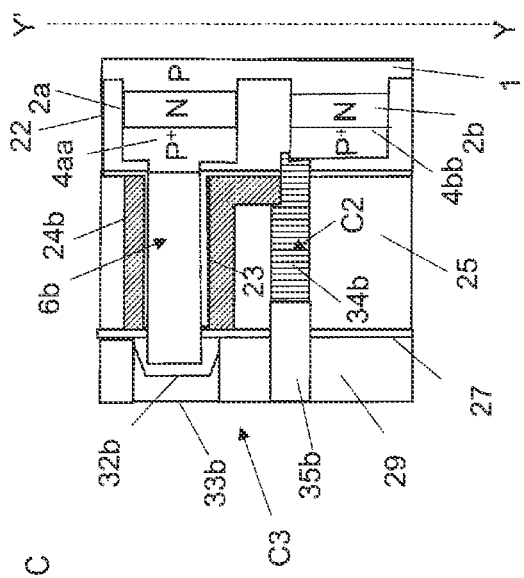
FIGS. 1RA to 1RC are a plan view and sectional structural views for describing a method for producing a pillar-shaped semiconductor device including SGTs according to a first embodiment.
Figure 1R:
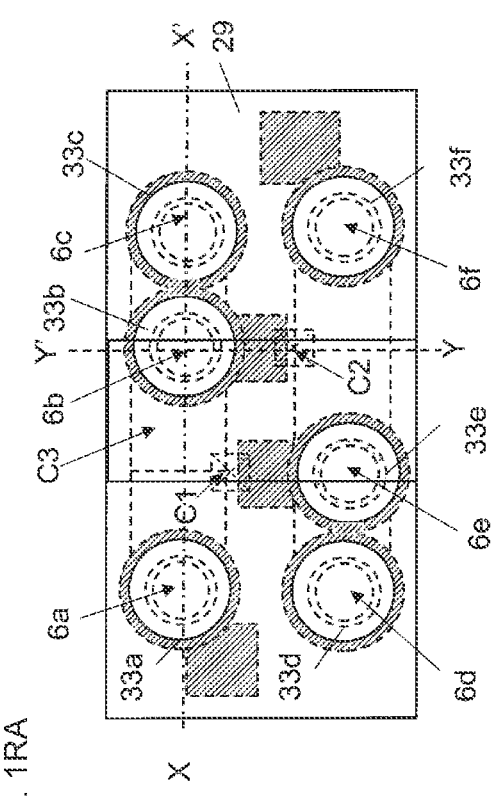
Figure 1R:
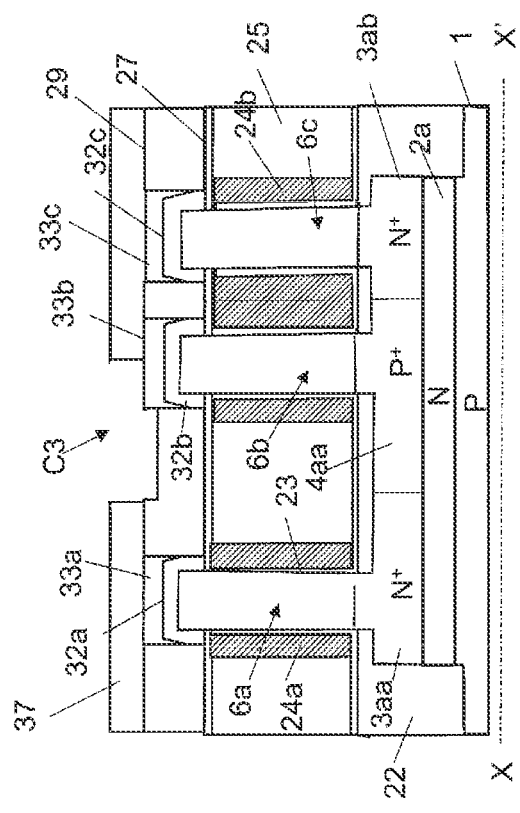

Next, a $SiO_2$ layer (not illustrated) is entirely deposited. As illustrated in FIGS. 1RA to 1RC, after a $SiO_2$ layer 37 (one example of a "third interlayer insulating layer" in Claims) is entirely formed, a band-shaped contact hole C3 (one example of a "first band-shaped contact hole" in Claims) that at least partly overlaps the W layers 33b and 33e on the Si pillars 6b and 6e in plan view and that extends in the Y direction is formed by lithography and RIE. The bottom of the band-shaped contact hole C3 may reach the upper surface of the SiN layer 27.

Next, as illustrated in FIGS. 1SA to 1SC, the band-shaped contact hole C3 is filled with a power supply wiring metal layer Vdd (one example of a "first wiring conductor layer" in Claims) that connects the W layers 33b and 33e to each other. The power supply wiring metal layer Vdd may be formed by using a material layer that is formed of a metal, an alloy, or a semiconductor containing a large amount of donor or acceptor impurities and that has a single-layer structure or a multilayer structure.

Figure 1T:
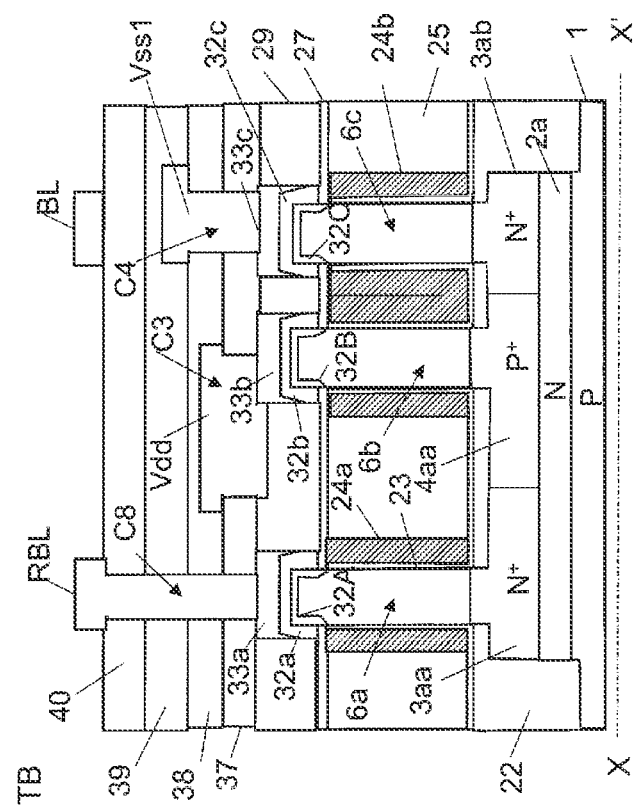
FIGS. 1TA to 1TC are a plan view and sectional structural views for describing a method for producing a pillar-shaped semiconductor device including SGTs according to a first embodiment.

Next, as illustrated in FIGS. 1TA to 1TC, a $SiO_2$ layer 38 having a flat upper surface is entirely formed. A ground wiring metal layer Vss1 is formed through a contact hole C4 formed on the W layer 33c present on the $N^+$ layer 32c. At the same time, a ground wiring metal layer Vss2 is formed through a contact hole C5 formed on the W layer 33d present on the $N^+$ layer 32d. A $SiO_2$ layer 39 having a flat upper surface is entirely formed. A word wiring metal layer WL is formed through contact holes C6 and C7 formed on the TiN layers 24a and 24d. A $SiO_2$ layer 40 having a flat upper surface is entirely formed. An inverted bit output wiring metal layer RBL and a bit output wiring metal layer BL are formed through contact holes C8 and C9 formed on the W layers 33a and 33f present on the $N^+$ layers 32a and 32f. Thus, an SRAM cell circuit is formed on the P layer substrate 1. In this SRAM circuit, load SGTs are formed at the Si pillars 6b and 6e, drive SGTs are formed at the Si pillars 6c and 6d, and selection SGTs are formed at the Si pillars 6a and 6f.

Through the heating process after formation of the $N^+$ layers 32a, 32c, 32d, and 32f and the $P^+$ layers 32b and 32e illustrated in FIGS. 1NA to 1NC and FIGS. 1OA to 1OC, donor or acceptor impurities diffuse from the $N^+$ layers 32a, 32c, 32d, and 32f and the $P^+$ layers 32b and 32e to the top portions of the Si pillars 6a to 6f, thereby forming $N^+$ layers 32A, 32C, 32D, and 32F (not illustrated) and $P^+$ layers 32B and 32E (not illustrated). The distribution shape of the $N^+$ layers 32A, 32C, 32D, and 32F and the $P^+$ layers 32B and 32E is a surface layer of the top portion or an entire top portion of the Si pillars 6a to 6f, depending on the history of the heating process and the diameter of the Si pillars 6a to 6f. Consequently, the $N^+$ layers 32a, 32c, 32d, and 32f, the $P^+$ layers 32b and 32e, the $N^+$ layers 32A, 32C, 32D, and 32F, and the $P^+$ layers 32B and 32E are formed so as to be connected to the top portions of the Si pillars 6a to 6f. The lower ends of the $N^+$ layers 32A, 32C, 32D, and 32F and the $P^+$ layers 32B and 32E in a vertical direction may be flush with the upper ends of the gate TiN layers 24a, 24b, 24c, and 24d or may be away from or overlap the gate TiN layers 24a, 24b, 24c, and 24d as long as a normal SGT operation is performed.

At the stage illustrated in FIGS. 1JA to 1JC, the mask material layers 7a, 7b, 7c, 7d, 7e, and 7f are not necessarily present. In this case, at the stage illustrated in FIGS. 1KA to 1KC or FIGS. 1LA to 1LC, the upper surfaces of the top portions of the Si pillars 6a to 6f can be made lower than that of the $Al_2O_3$ layer 29 by, for example, etching the top portions of the Si pillars 6a to 6f or oxidizing and then removing the top portions of the Si pillars 6a to 6f.

The formation of the band-shaped contact hole C3 illustrated in FIGS. 1RA to 1RC requires the following conditions.

Condition 1

There are no Si pillars other than load SGTs (corresponding to 6a, 6c, 6d, and 6f in this embodiment) in a region of the band-shaped contact hole C3 in plan view.

Condition 2

When viewed in plan, the band-shaped contact hole C3 may be formed so as to be connected to another adjacent SRAM cell in the Y direction or may be formed so as to be separated from the other SRAM cell. However, when viewed in plan, the Si pillars that constitute load SGTs (corresponding to the Si pillars 6b and 6c in this embodiment) need to be connected to each other in both the X direction and the Y direction.

Condition 3

The band-shaped contact hole C3 is formed to establish a connection between the impurity region (corresponding to the P⁺ layers 32b and 32e in this embodiment) serving as a source or drain of an SGT and connected to the top portion of a Si pillar and a wiring conductor layer formed of a metal, an alloy, or the like.

The production method according to the first embodiment provides the following features.

Feature 1

In this embodiment, the P⁺ layers 32b and 32e are formed in the recessed portions 30B and 30E formed in a self-aligned manner with the Si pillars 6b and 6e. Similarly, the W layers 33b and 33e on the P⁺ layers 32b and 32e are also formed in the recessed portions 30B and 30E. Thus, the W layers 33b and 33e are separated with certainty from the adjacent N⁺ layers 32c and 32d and W layers 33c and 33d formed in the same manner. Furthermore, since the P⁺ layers 32b and 32e are formed so as to cover the top portions of the Si pillars 6b and 6e, the source or drain resistance can be decreased compared with the case where impurity layers are formed only at the top portions of the Si pillars 6b and 6e to form a source or drain of an SGT. Moreover, since the W layers 33b and 33e are in contact with the entire upper surfaces of the P⁺ layers 32b and 32e, the power supply wiring metal layer Vdd serving as a wiring conductor layer may be partly connected to regions of the W layers 33b and 33e while being separated from the adjacent W layers 33b and 33e. This indicates that the contact hole C3 for connecting the power supply wiring metal layer Vdd serving as a wiring conductor layer to the W layers 33b and 33e can be formed apart from the W layers 33c and 33d. As a result, an SRAM cell circuit including SGTs having high density and low source or drain resistance is formed. The two SGTs formed at the Si pillars 6b and 6c constitute a CMOS inverter circuit. Similarly, the two SGTs formed at the Si pillars 6d and 6e constitute a CMOS inverter circuit. This shows that this embodiment can be applied to other logic circuits. Thus, this embodiment can contribute to formation of a high-density and high-performance circuit including SGTs.

Feature 2

In the related art, contact holes are independently formed on the Si pillars 6b and 6e at which load SGTs are formed. The distance between the two contact holes is shorter than the distance between contact holes at drive SGTs or selection SGTs. In this case, an increase in the degree of integration of SRAM cells makes it difficult to form the two independent contact holes through a single process of lithography and RIE. Therefore, for example, a process of lithography and RIE needs to be performed twice. This case poses problems such as an increase in cost due to an increase in the number of steps and a decrease in the degree of integration due to introduction of margins for mask alignment between two lithography processes. This case also poses production difficulties of precisely forming two adjacent minute contact holes that are independent of each other. In contrast, in this embodiment, the band-shaped contact hole C3 is formed so as to overlap, in plan view, the P⁺ layers 32b and 32e and the W layers 33b and 33e above the two Si pillars 6b and 6e at which load SGTs are formed. Thus, the power supply wiring metal layer Vdd is connected to the P⁺ layers 32b and 32e through the band-shaped contact hole C3. In this embodiment, independent contact holes are not formed above the Si pillars 6b and 6e. This can decrease the cost because of formation of a contact hole through a single process of lithography and RIE and can prevent a decrease in the degree of integration because there is no need to ensure margins for mask alignment. Furthermore, the band-shaped contact hole C3 can be formed in a large area compared with the known method in which two independent contact holes are formed, which can improve the precision of patterns. Thus, an SRAM cell circuit including SGTs with a high degree of integration and high performance is formed at low cost in this embodiment. Similarly, a logic circuit including SGTs with a high degree of integration and high performance is formed.

Second Embodiment

Hereafter, a method for producing an SRAM cell circuit including SGTs according to a second embodiment of the present invention will be described with reference to FIG. 2AA to FIG. 2GC. Among FIG. 2AA to FIG. 2GC, figures suffixed with A are plan views, figures suffixed with B are sectional structural views taken along lines X-X' in the corresponding figures suffixed with A, and figures suffixed with C are sectional structural views taken along lines Y-Y' in the corresponding figures suffixed with A.

In this embodiment, the processes in FIG. 1AA to FIG. 1QC described in the first embodiment are performed. A resist layer (not illustrated) is entirely deposited. As illustrated in FIGS. 2AA to 2AC, a resist layer 42 (one example of a "first mask material layer" in Claims) having a band-shaped opening that overlaps the Si pillars 6b and 6e in plan view is formed on the SiN layer 41, the mask material layers 7a to 7f, and the SiO₂ layers 28a to 28f by lithography.

Figure 2B:
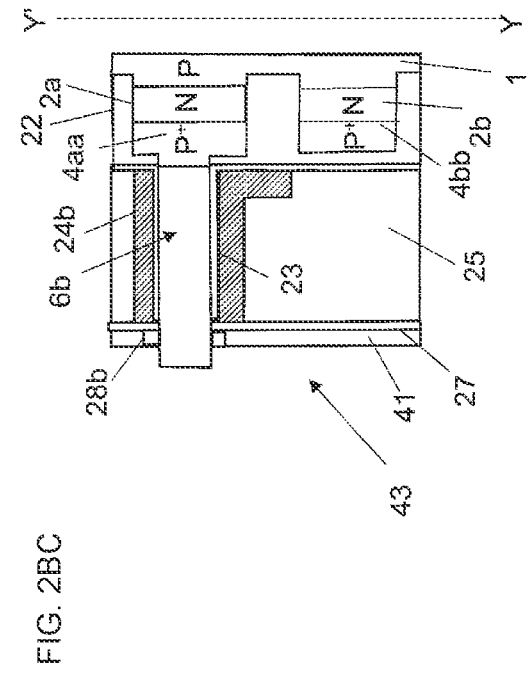
FIGS. 2BA to 2BC are a plan view and sectional structural views for describing a method for producing a pillar-shaped semiconductor device including SGTs according to a second embodiment of the present invention.
Figure 2B:
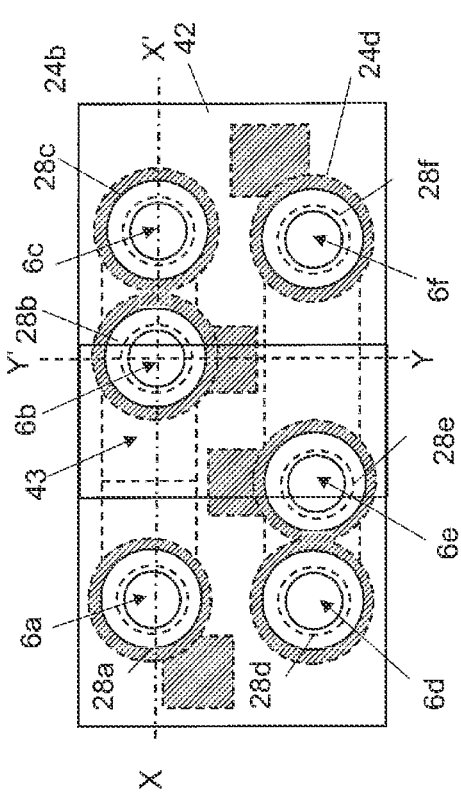
Figure 2B:
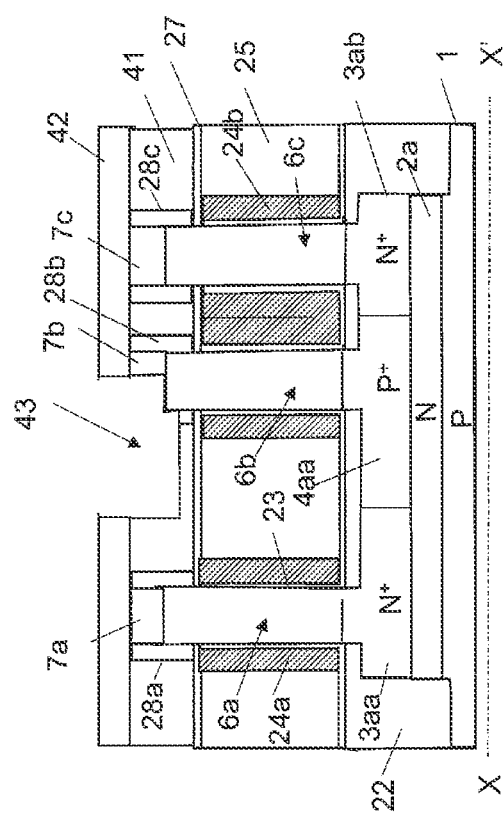

Next, as illustrated in FIGS. 2BA to 2BC, the SiN layer 41, the mask material layers 7b and 7e, and the SiO₂ layers 28b and 28e are etched by RIE using the resist layer 42 as a mask so as to have upper surfaces positioned lower than the upper surfaces of the top portions of the Si pillars 6b and 6e. Thus, a recessed portion 43 is formed. The bottom of the recessed portion 43 may reach the SiN layer 27.

Next, the resist layer 42 is removed. As illustrated in FIGS. 2CA to 2CC, the mask material layers 7b and 7e and the SiO₂ layers 28b and 28e on the Si pillars 6b and 6e are removed to form a recessed portion 43A (one example of a "third recessed portion" in Claims). The recessed portion 43A is constituted by a rectangular portion that extends in the Y direction and portions of the SiO₂ layers 28b and 28e that have been removed, the portions surrounding the top portions of the Si pillars 6b and 6e.

Figure 2D:
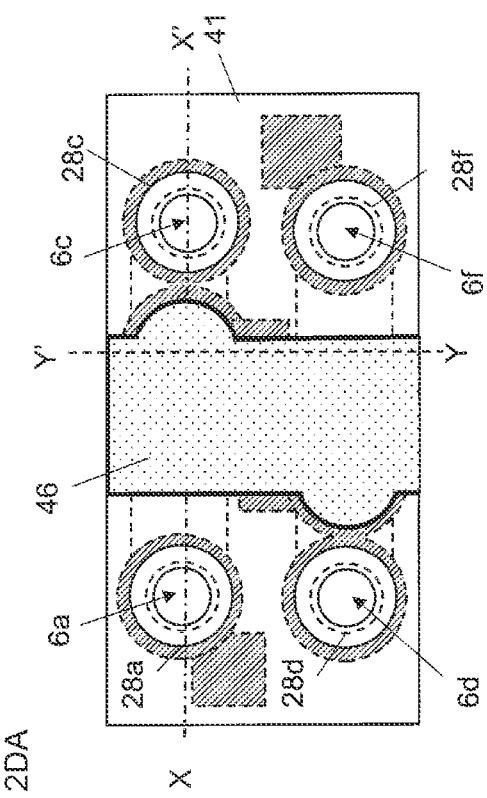
FIGS. 2DA to 2DC are a plan view and sectional structural views for describing a method for producing a pillar-shaped semiconductor device including SGTs according to a second embodiment of the present invention.
Figure 2D:
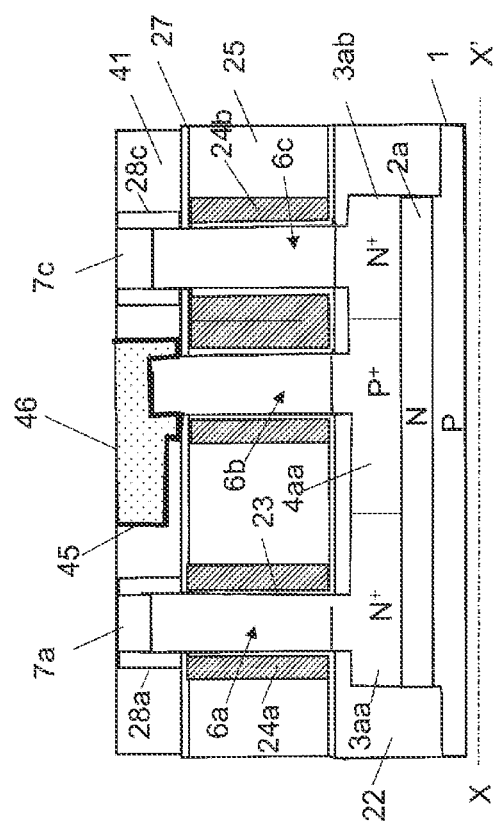
Figure 2D:
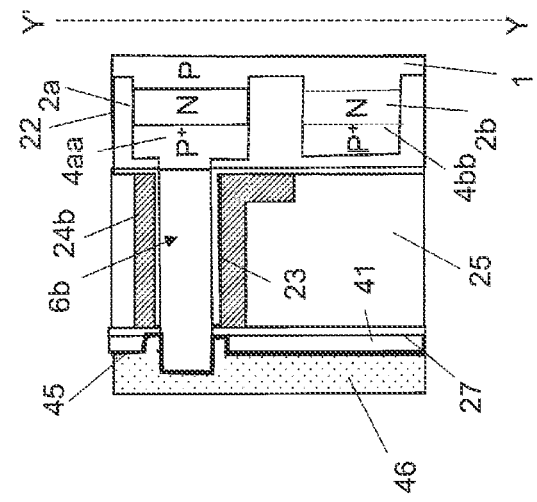

Next, a thin single crystal Si layer (not illustrated) is entirely deposited by ALD and a P⁺ layer (not illustrated) containing acceptor impurities is entirely deposited by epitaxial growth. The P⁺ layer and the thin Si layer are polished so as to have upper surfaces that are flush with that of the SiN layer 41. Thus, a thin single crystal Si layer 45 (one example of a "single crystal semiconductor thin film layer" in Claims) and a P⁺ layer 46 are formed as illustrated in FIGS. 2DA to 2DC.

Next, as illustrated in FIGS. 2EA to 2EC, upper portions of the thin Si layer 45 and the P⁺ layer 46 are etched to form a P⁺ layer 46b. A mask material layer 49b that is present on the P⁺ layer 46b and that has an upper surface flush with that of the SiN layer 41 is formed by CVD and CMP. The mask material layers 7a, 7c, 7d, and 7f on the top portions of the Si pillars 6a, 6c, 6d, and 6f and the SiO₂ layers 28a, 28c, 28d, and 28f at the outer peripheries of the top portions of the Si pillars 6a, 6c, 6d, and 6f are removed to form recessed portions 43A, 43C, 43D, and 43E on the top portions of the Si pillars 6a, 6c, 6d, and 6f. The P⁺ layer 46b is constituted by an impurity layer (one example of a "third impurity layer" in Claims) connected to the P⁺ layer 32b (one example of a "first impurity layer" in Claims) and the P⁺ layer 32e (one example of a "second impurity layer" in Claims) illustrated in FIGS. 1NA to 1NC in the first embodiment. The P⁺ layer 46b may be formed by selective epitaxial growth as in the first embodiment. Alternatively, a single crystal P⁺ layer 46b may be formed by another method such as molecular beam epitaxy.

Figure 2F:
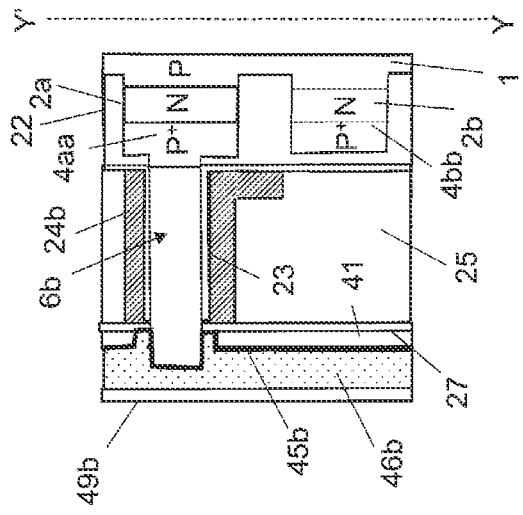
FIGS. 2FA to 2FC are a plan view and sectional structural views for describing a method for producing a pillar-shaped semiconductor device including SGTs according to a second embodiment of the present invention.
Figure 2F:
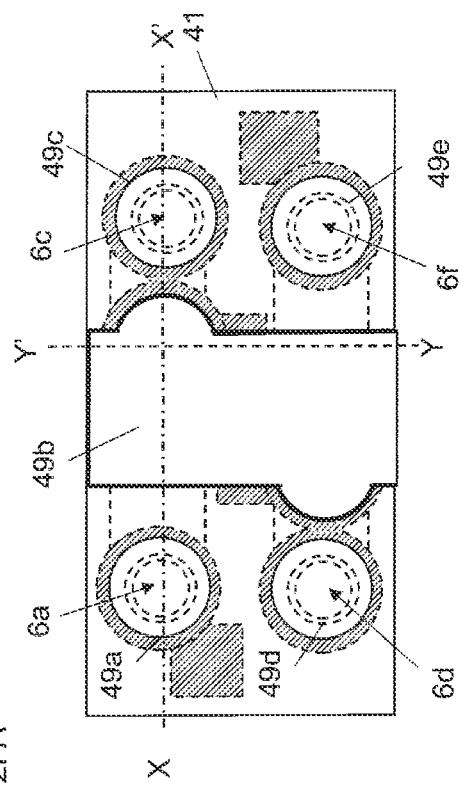
Figure 2F:
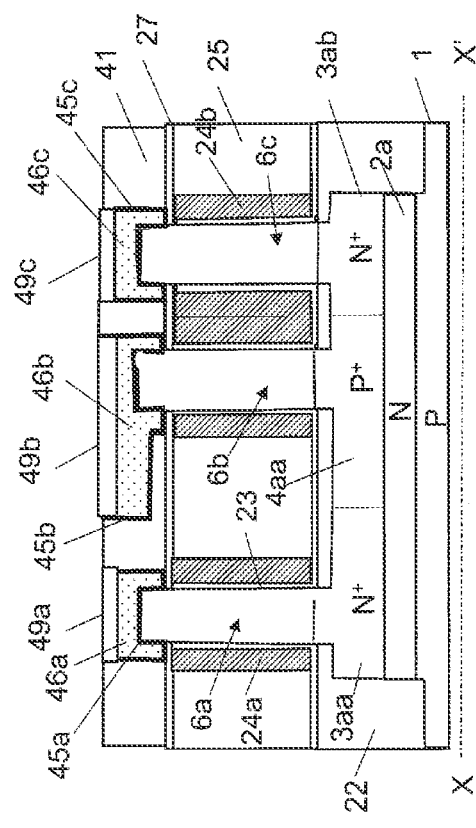

Next, as illustrated in FIGS. 2FA to 2FC, thin single crystal Si layers 45a, 45c, 45d (not illustrated), and 45e (not illustrated) and N⁺ layers 46a, 46c, 46d (not illustrated), and 46e (not illustrated) containing donor impurities are formed in the recessed portions 43A, 43C, 43D, and 43E by the same method as that for forming the P⁺ layer 46b. Mask material layers 49a, 49c, 49d, and 49e are formed on the N⁺ layers 46a, 46c, 46d, and 46e so as to have upper surfaces that are flush with that of the SiN layer 41.

Next, the mask material layers 49a, 49b, 49c, 49d, and 49e are removed. As illustrated in FIGS. 2GA to 2GC, W layers 50a, 50b (one example of a "third conductor layer" in Claims), 50c, and 50e are formed on the N⁺ layers 46a, 46c, 46d, and 46e and the P⁺ layer 46b by CVD and CMP. A SiO₂ layer 52 is entirely formed. A band-shaped contact hole C10 is formed by removing a part of the SiO₂ layer 52 on the W layer 50b using lithography and RIE. A band-shaped power supply wiring metal layer VDD connected to the W layer 50b is formed through the band-shaped contact hole C10. By performing the process illustrated in FIGS. 1TA to 1TC, an SRAM cell circuit is formed on the P layer substrate 1. The W layers 50a, 50b, 50c, and 50e may be conductor layers formed of another metal or an alloy and having a single-layer structure or a multilayer structure.

Since the thin single crystal Si layers 45a to 45e are layers for forming the P⁺ layer 46b and the N⁺ layers 48a, 48b, 48c, and 48d that have good crystallinity, they may be another single crystal semiconductor thin film layer as long as this purpose is achieved.

Impurity layers containing donor impurity atoms may be formed in the top portions of the Si pillars 6a, 6c, 6d, and 6f below the thin single crystal Si layers 45a to 45e, and impurity layers containing acceptor impurity atoms may be formed in the top portions of the Si pillars 6b and 6e. These impurity layers may be formed through thermal diffusion of acceptor impurity atoms and donor impurity atoms from the P⁺ layer 46b and the N⁺ layers 46a, 46c, and 46e after formation of the thin single crystal Si layers 45a to 45e. For these impurity layers, the P⁺ layer 46b and the N⁺ layers 46a, 46c, and 46e may be formed by introducing acceptor impurity atoms and donor impurity atoms to the top portions of the Si pillars 6a to 6f before formation of the thin single crystal Si layers 45a to 45e.

The production method according to the second embodiment provides the following features.

Feature 1

In the first embodiment, the P⁺ layers 32b and 32e are formed by selective epitaxial growth in the recessed portions 30B and 30E at the outer peripheries of the top portions of the Si pillars 6b and 6e. The P⁺ layers 32b and 32e in contact with the top portions of the Si pillars 6b and 6e need to have good crystallinity Poor crystallinity poses a problem such as an increase in the resistance of diodes due to the P⁺ layers 32b and 32e, an increase in the leak current, or a decrease in the withstanding voltage of junctions. To improve the crystallinity, the areas of the recessed portions 30B and 30E in which crystal growth is performed in plan view are desirably increased. However, since the areas of the recessed portions 30B and 30E are decreased by increasing the density of the SRAM cell, it is difficult to form P⁺ layers 32b and 32e having good crystallinity. In contrast, in this embodiment, the area of the recessed portion 43A in which epitaxial growth is performed is larger than those of the recessed portions 30B and 30E in the first embodiment. Therefore, a P⁺ layer 46 having good crystallinity can be formed. This decreases the diode resistance and the leak current and increases the withstanding voltage. Furthermore, a P⁺ layer 46 having better crystallinity can be formed by forming a single crystal thin film Si layer 45 and then performing epitaxial growth on a P⁺ layer 46.

Feature 2

In this embodiment, the P⁺ layer 46b and the N⁺ layers 46a, 46c, 46d, and 46e include impurity regions that concentrically surround the top portions of the Si pillars 6a to 6f through self-alignment. This shortens the distance between the two adjacent Si pillars 6b and 6c and the distance between the two adjacent Si pillars 6d and 6e, which further increases the density of the SRAM cell. Similarly, the W layers 50a to 50e on the P⁺ layer 46b and the N⁺ layers 46a, 46c, 46d, and 46e are formed in the recessed portions 43A to 43E formed through self-alignment. Thus, the contact hole C10 for connecting the W layer 50b and the power supply wiring metal layer VDD can be separated from the W layers 50a, 50c, 50d, and 50e on the adjacent Si pillars 6a, 6c, 6d, and 6f. This increases the density of the SRAM cell.

Third Embodiment

Hereafter, a method for producing an SRAM cell circuit including SGTs according to a third embodiment of the present invention will be described with reference to FIG. 3AA to FIG. 3CC. Among FIG. 3AA to FIG. 3CC, figures suffixed with A are plan views, figures suffixed with B are sectional structural views taken along lines X-X' in the corresponding figures suffixed with A, and figures suffixed with C are sectional structural views taken along lines Y-Y' in the corresponding figures suffixed with A.

Figure 3A:
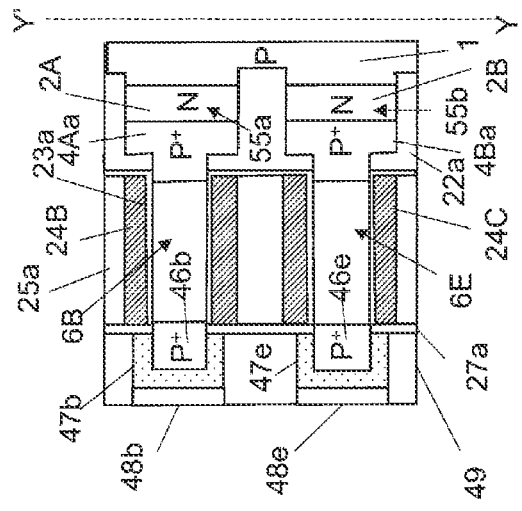
FIGS. 3AA to 3AC are a plan view and sectional structural views for describing a method for producing a pillar-shaped semiconductor device including SGTs according to a third embodiment of the present invention.
Figure 3A:
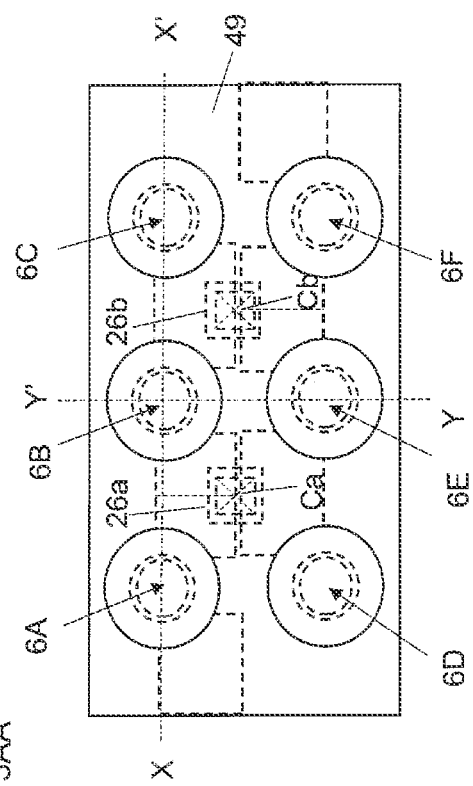
Figure 3A:
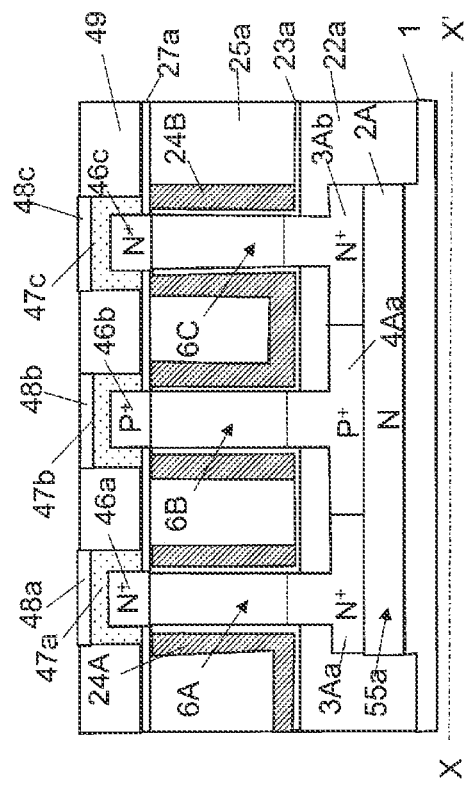

As illustrated in FIGS. 3AA to 3AC, a Si pillar base 55a constituted by an N layer 2A, N⁺ layers 3Aa and 3Ab, and a P⁺ layer 4Aa and a Si pillar base 55b constituted by an N layer 2B, N⁺ layers 3Ba (not illustrated) and 3Bb (not illustrated), and a P⁺ layer 4Ba are formed on the P layer substrate 1. Si pillars 6A, 6B, 6C, 6D, 6E, and 6F are formed on the Si pillar bases 55a and 55b. A straight line connecting the centers of the Si pillars 6B and 6E extends in a Y direction. Similarly, a straight line connecting the centers of the Si pillars 6A and 6D and a straight line connecting the centers of the Si pillars 6C and 6F also extend in the Y direction. A SiO₂ layer 22a is formed at the outer peripheries of the bottom portions of the Si pillars 6A to 6F. A gate HfO₂ layer 23a is entirely formed by ALD. A gate TiN layer 24A is formed so as to surround the HfO₂ layer 23a around the Si pillar 6A. At the same time, a gate TiN layer 24B is formed so as to surround the HfO₂ layer 23a around the Si pillars 6B and 6C. At the same time, a gate TiN layer 24C is formed so as to surround the HfO₂ layer 23a around the Si pillars 6D and 6E. At the same time, a gate TiN layer 24D (not illustrated) is formed so as to surround the HfO₂ layer 23a around the Si pillar 6F. A SiO₂ layer 25a is formed so as to surround the gate TiN layers 24A, 24B, 24C, and 24D. A W layer 26a connected to the TiN layer 24C, the N⁺ layer 3Aa, and the P⁺ layer 4Aa through a contact hole Ca formed in the SiO₂ layer 25a is formed so as to have an upper surface positioned lower than those of the TiN layers 24A to 24D. At the same time, a W layer 26b connected to the TiN layer 24B, the N+ layer 3Bb, and the P+ layer 4Ba through a contact hole Cb formed in the SiO$_2$ layer 25a is formed so as to have an upper surface positioned lower than those of the TiN layers 24A to 24D. A SiN layer 27a is formed at the outer peripheries of the top portions of the Si pillars 6A to 6F and on the upper ends of the gate TiN layers 24A to 24D. N+ layers 46a, 46c, 46d (not illustrated), and 46f (not illustrated) are formed in the top portions of the Si pillars 6A, 6C, 6D, and 6F, and P+ layers 46b and 46e are formed in the top portions of the Si pillars 6B and 6E. Through the same processes illustrated in FIG. 1KA to FIG. 1PC in the first embodiment, N+ layers 47a, 47c, 47d (not illustrated), and 47f (not illustrated) and P+ layers 47b and 47e are formed by selective epitaxial growth. W layers 48a, 48b, 48c, 48d (not illustrated), 48e, and 48f (not illustrated) are formed on the N+ layers 47a, 47c, 47d, and 47f and the P+ layers 47b and 47e. A SiO$_2$ layer 49 is formed at the outer peripheries of the N+ layers 47a, 47c, 47d, and 47f, the P+ layers 47b and 47e, and the W layers 48a, 48b, 48c, 48d, 48e, and 48f.

Figure 3B:
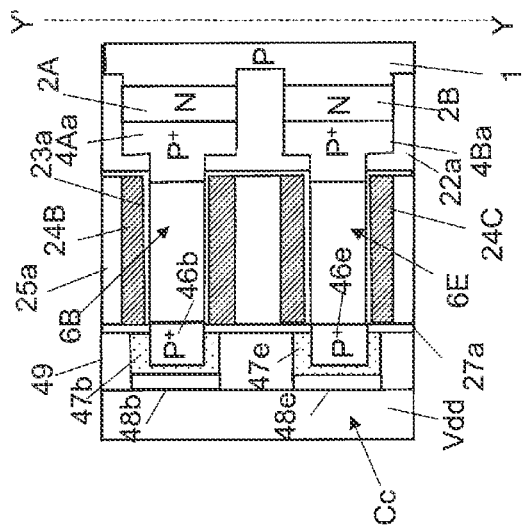
FIGS. 3BA to 3BC are a plan view and sectional structural views for describing a method for producing a pillar-shaped semiconductor device including SGTs according to a third embodiment of the present invention.
Figure 3B:
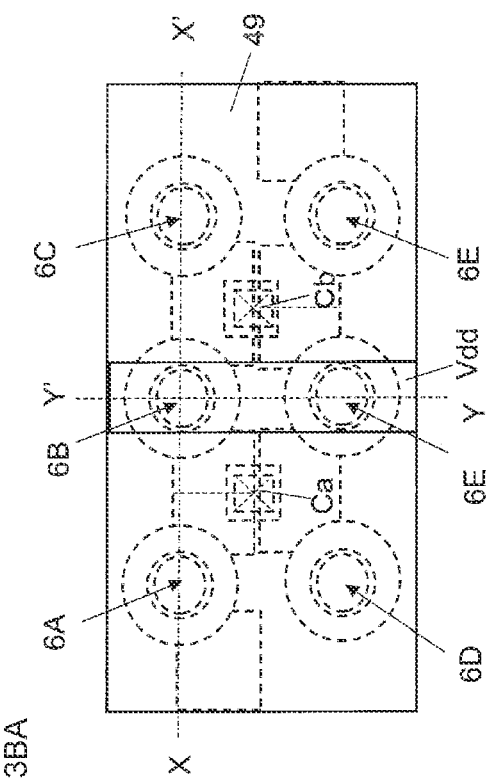
Figure 3B:
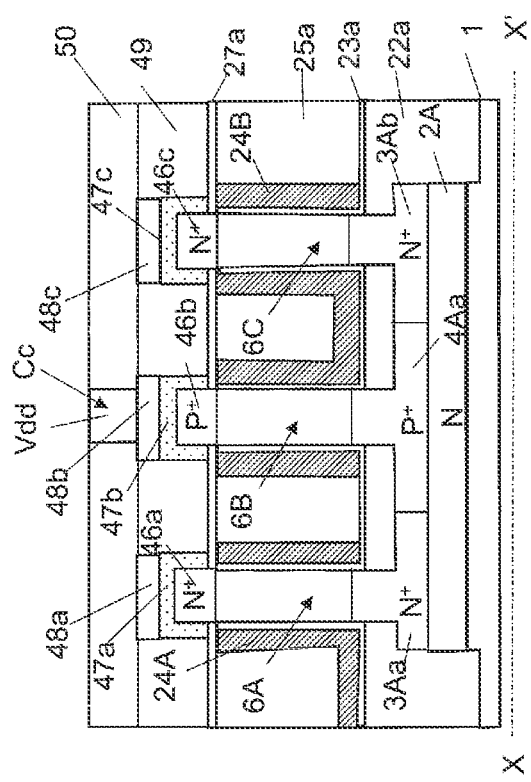

Next, as illustrated in FIGS. 3BA to 3BC, a SiO$_2$ layer 50 is formed on the W layers 48a, 48b, 48c, 48d, 48e, and 48f and the SiO$_2$ layer 49. A band-shaped contact hole Cc that overlaps the W layers 48b and 48e in plan view and extends in the Y direction is formed by lithography and RIE so as to have a bottom that is flush with the upper surfaces of the P+ layers 47b and 47e. The band-shaped contact hole Cc is inside the W layer 48b on the line X-X' in plan view. The same applies to the relationship between the band-shaped contact hole Cc and the W layer 48e. A power supply wiring metal layer Vdd connected to the P+ layers 47b and 47e is formed such that the contact hole Cc is filled with the power supply wiring metal layer Vdd. In this case, the SiO$_2$ layer 50 and the power supply wiring metal layer Vdd are made flush with each other by CMP. This prevents the power supply wiring metal layer Vdd from protruding from the band-shaped contact hole Cc in plan view.

Next, as illustrated in FIGS. 3CA to 3CC, a SiO$_2$ layer 51 having a flat upper surface is entirely formed. A ground wiring metal layer Vss1 is formed through a contact hole Cd formed on the W layer 48a. At the same time, a ground wiring metal layer Vss2 is formed through a contact hole Ce formed on the W layer 48f. A SiO$_2$ layer 52 having a flat upper surface is entirely formed. Word wiring metal layers WL are formed through contact holes Cf and Cg formed on the TiN layers 24A and 24D. A SiO$_2$ layer 53 having a flat upper surface is entirely formed. A bit output wiring metal layer BL and an inverted bit output wiring metal layer RBL are formed through contact holes Ch and Ci formed on the W layers 48c and 48d. Thus, an SRAM cell circuit is formed on the P layer substrate 1.

The production method according to the third embodiment provides the following feature.
Feature 1

In the first embodiment, the Si pillars 6b and 6e are formed in different positions in the X direction. In contrast, in this embodiment, the centers of the Si pillars 6B and 6E are on a single line extending in the Y direction. Although the arrangement of the Si pillars 6A to 6F in the SRAM cell in this embodiment is different from the arrangement of the Si pillars 6a to 6f in the first embodiment, this embodiment has the same features as the first embodiment. The P+ layers 47b and 47e and the W layers 48b and 48e are formed in a self-aligned manner with the Si pillars 6B and 6E. Thus, the P+ layers 47b and 47e and the W layers 48b and 48e can be separated with certainty from the N+ layers 47c and 47d and the W layers 48c and 48d formed at the top portions of the adjacent Si pillars 6C and 6D. Furthermore, the P+ layers 47b and 47e cover the P+ layers 46b and 46e, and thus a low-resistance source or drain region is formed.
Feature 2

In this embodiment, the band-shaped contact hole Cc is inside the W layer 48b on the line X-X'. The same applies to the relationship between the band-shaped contact hole Cc and the W layer 48e. Furthermore, since it is sufficient that the band-shaped contact hole Cc is partly connected to the W layers 48b and 48e in plan view, a decrease in yield due to mask misalignment can be prevented. The band-shaped contact hole Cc can be formed on the W layers 48b and 48e in a large area compared with the method in which two independent contact holes are formed, which can improve the precision of patterns. Thus, an SRAM cell including SGTs with a high degree of integration and high precision is formed at low cost.

Fourth Embodiment

Hereafter, a method for producing an SRAM cell circuit including SGTs according to a fourth embodiment of the present invention will be described with reference to FIGS. 4A to 4C. FIG. 4A is a plan view, FIG. 4B is a sectional structural view taken along line X-X' in FIG. 4A, and FIG. 4C is a sectional structural view taken along line Y-Y' in FIG. 4A.

Figure 2G:
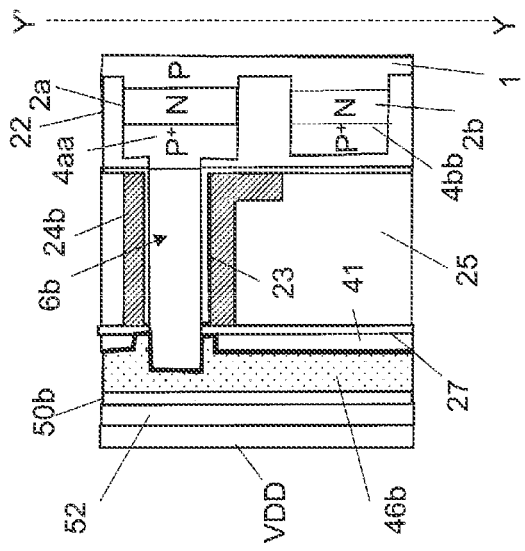
FIGS. 2GA to 2GC are a plan view and sectional structural views for describing a method for producing a pillar-shaped semiconductor device including SGTs according to a second embodiment of the present invention.
Figure 2G:
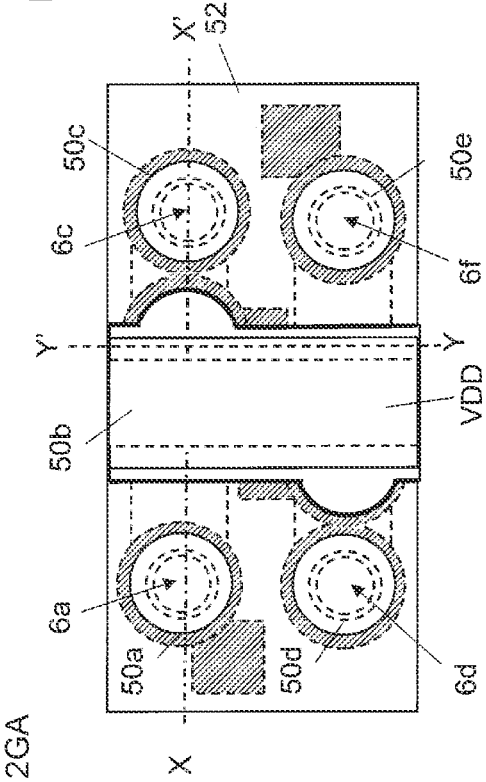
Figure 2G:
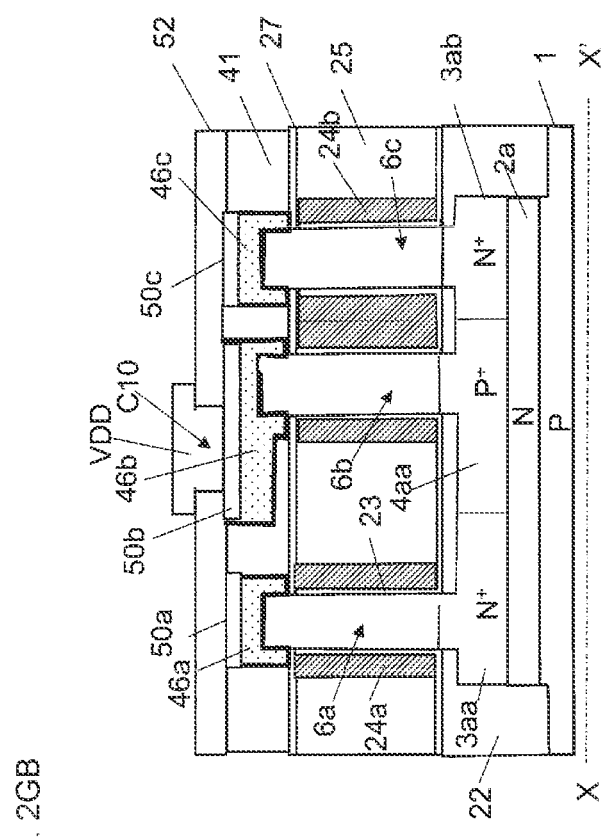
Figure 4C:
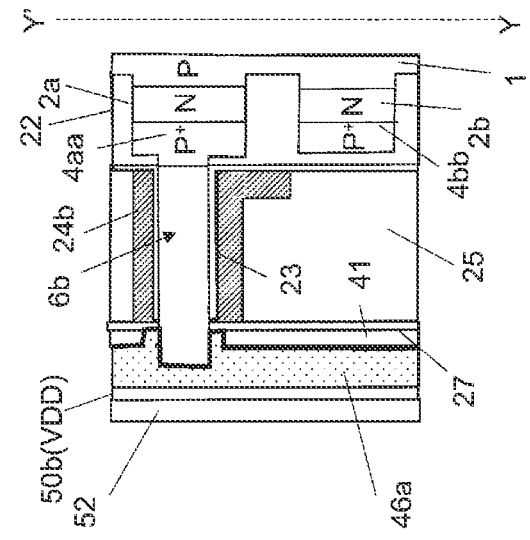
FIGS. 4A to 4C are a plan view and sectional structural views for describing a method for producing a pillar-shaped semiconductor device including SGTs according to a fourth embodiment of the present invention.
Figure 4A:
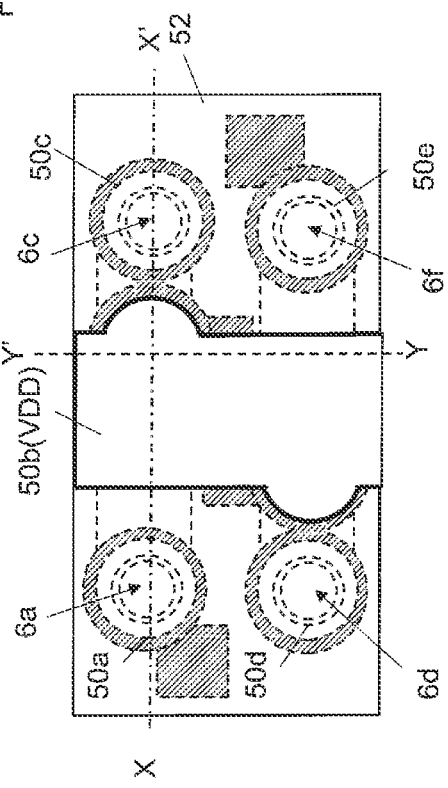
Figure 4B:
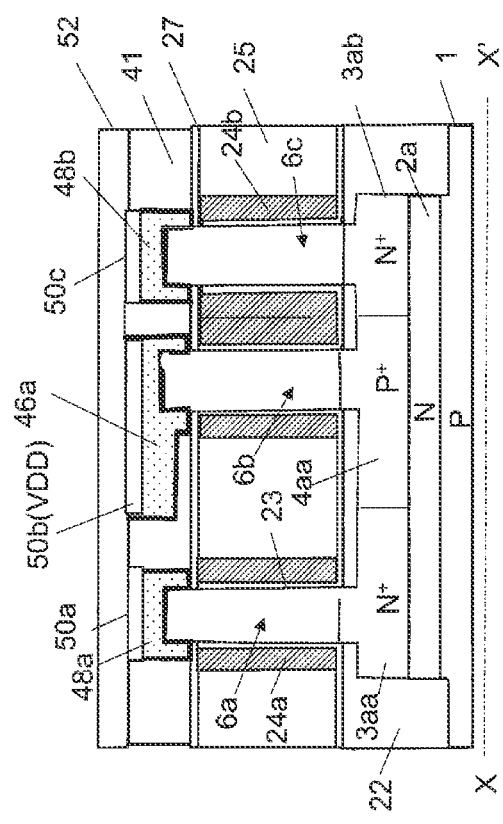
Figure 6:
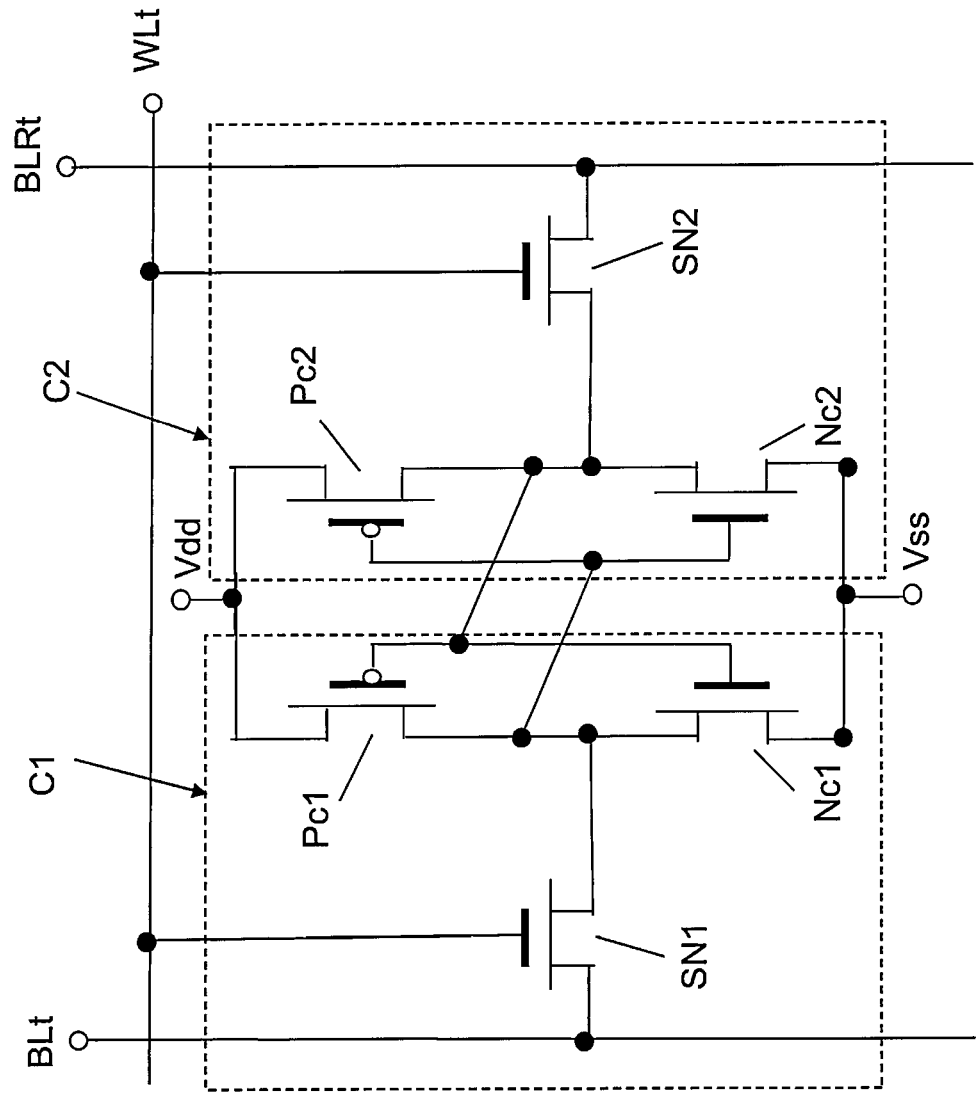
FIG. 6 illustrates an SRAM cell circuit including SGTs in the related art.

As illustrated in FIGS. 4A to 4C, the contact hole C10 and the power supply wiring metal layer VDD illustrated in FIGS. 2GA to 2GC are not formed. The W layer 50b serves as the power supply wiring metal layer VDD.

The production method according to the fourth embodiment provides the following feature.

In this embodiment, since the W layer 50b serves as the power supply wiring metal layer VDD, there is no need to perform steps of forming the contact hole C10 and forming the power supply wiring metal layer VDD in an SRAM cell region illustrated in FIGS. 2GA to 2GC in the second embodiment. This can prevent decreases in the degree of integration and the yield caused by formation of a contact hole and a wiring metal layer in an SRAM cell. When the present invention is applied to logic circuits, the distance from a unit circuit region to a wire-extending external terminal can be shortened, which makes it easier to form a conductor layer corresponding to the W layer 50b. This embodiment may also be applied to only a logic circuit region in a microprocessor circuit.

Other Embodiments

In the embodiments according to the present invention, one SGT is formed in one semiconductor pillar. The present invention can also be applied to formation of circuits in which two or more SGTs are formed in one semiconductor pillar. The present invention can be applied to connection between impurity layers at the top portions of SGTs located at uppermost portions of two semiconductor pillars including two or more SGTs formed therein.

In the first embodiment, the Si pillars 6a to 6f are formed. Alternatively, semiconductor pillars made of another semiconductor material may be formed. The same applies to other embodiments according to the present invention.

The N+ layers 32a, 32c, 32d, and 32f and the P+ layers 32b and 32e in the first embodiment may each be a Si layer or another semiconductor material layer containing donor or acceptor impurities. The N+ layers 32a, 32c, 32d, and 32f and the P+ layers 32b and 32e may be different semiconductor material layers. The same applies to other embodiments according to the present invention.

In the first embodiment, the N+ layers 32a, 32c, 32d, and 32f and the P+ layers 32b and 32e are formed by selective epitaxial growth. The N+ layers 32a, 32c, 32d, and 32f and the P+ layers 32b and 32e may be selectively formed by another method such as a method in which chemical dry etching (CDE) and typical epitaxial growth are repeatedly performed to form the N+ layers 32a, 32c, 32d, and 32f and the P+ layers 32b and 32e on the top portions of the Si pillars 6a to 6f in the recessed portions 30A to 30F. The same applies to other embodiments according to the present invention.

The SiN layer 27 at the outer peripheries of the Si pillars 6a to 6f, the SiO$_2$ layers 28a to 28f formed on the side surfaces of the exposed top portions of the Si pillars 6a to 6f and the mask material layers 7a to 7f, and the Al$_2$O$_3$ layer 29 that surrounds the SiO$_2$ layers 28a to 28f in the first embodiment may each be another material layer having a single-layer structure or a multilayer structure and containing an organic material or an inorganic material as long as the object of the present invention is achieved. The same applies to other embodiments according to the present invention.

In the first embodiment, the mask material layer 7 is formed of a SiO$_2$ layer, an aluminum oxide (Al$_2$O$_3$, also referred to as AlO) layer, and a SiO$_2$ layer. The mask material layer 7 may be another material layer having a single-layer structure or a multilayer structure and containing an organic material or an inorganic material as long as the object of the present invention is achieved. The same applies to other embodiments according to the present invention.

In the first embodiment, as illustrated in FIGS. 1CA to 1CC and FIGS. 1DA to 1DC, the band-shaped SiN layers 13aa, 13ab, 13ba, and 13bb entirely formed by ALD are formed on both sides of the band-shaped SiGe layers 8a and 8b. The band-shaped SiN layers 13aa, 13ab, 13ba, and 13bb and the band-shaped SiGe layers 8a and 8b may each be another material layer having a single-layer structure or a multilayer structure and containing an organic material or an inorganic material as long as the object of the present invention is achieved. The same applies to other embodiments according to the present invention.

As described in FIG. 1AA to FIG. 1GC, the band-shaped mask material layers 17a and 17b that extend in the X direction so as to be orthogonal to the band-shaped mask material layers 12aa, 12ab, 12ba, and 12bb and the band-shaped SiN layers 13aa, 13ab, 13ba, and 13bb which extend in the Y direction are formed by the same method as that for forming the band-shaped SiN layers 13aa, 13ab, 13ba, and 13bb. Thus, the Si pillars 6a to 6f are formed with high precision and high density in both the X direction and the Y direction. In the description of this embodiment, the band-shaped mask material layers 17a and 17b are formed after formation of the band-shaped mask material layers 12aa, 12ab, 12ba, and 12bb and the band-shaped SiN layers 13aa, 13ab, 13ba, and 13bb. On the other hand, even in the process in which the band-shaped mask material layers 12aa, 12ab, 12ba, and 12bb and the band-shaped SiN layers 13aa, 13ab, 13ba, and 13bb are formed after formation of the band-shaped mask material layers 17a and 17b, the Si pillars 6a to 6f can be formed with high precision and high density. In the design, if there are margins in the Y direction, the band-shaped mask material layers 17a and 17b may be directly formed by lithography and RIE without using this method. If there are margins in the X direction, the band-shaped SiN layers 13aa, 13ab, 13ba, and 13bb may be directly formed by lithography and RIE without using this method. Furthermore, as long as the performance of the SRAM cell can be satisfied, the band-shaped mask material layers 12aa, 12ab, 12ba, and 12bb that extend in the X direction and the band-shaped mask material layers 17a and 17b may be formed using self-aligned double patterning (SADP, e.g., refer to A. Raley, S. Thibaut, N. Mohanty, K. Subhadeep, S. Nakamura, et al., "Self-aligned quadruple patterning integration using spacer on spacer pitch splitting at the resist level for sub-32 nm pitch applications," Proc. Of SPIE Vol. 9782, 2016) or self-aligned quadruple patterning (SAQP, e.g., refer to A. Raley, S. Thibaut, N. Mohanty, K. Subhadeep, S. Nakamura, et al., "Self-aligned quadruple patterning integration using spacer on spacer pitch splitting at the resist level for sub-32 nm pitch applications," Proc. Of SPIE Vol. 9782, 2016). The same applies to other embodiments according to the present invention.

In the first embodiment, as described in FIGS. 1HA to 1HC and FIGS. 1IA and 1IC, after formation of the SiN pillars 20a, 20b, 20c, 20d, 20e, 20f, 20g, and 20h on which the rectangular mask material layers 19a, 19b, 19c, 19d, 19e, 19f, 19g, and 19h are formed, the rectangular mask material layers 19b and 19g and the SiN pillars 20b and 20g are removed. Thus, a contact hole C1, C2 formation region is formed in which Si pillars are not present in regions of the contact holes C1 and C2 in FIGS. 1AA to 1TC in plan view. On the other hand, after Si pillars are formed in a contact hole C1, C2 formation region, the Si pillars may be removed to form a contact hole C1, C2 formation region. Alternatively, the contact hole C1, C2 formation region may be formed by a method in which Si pillars are not formed in the regions of the contact holes C1 and C2 by performing a step of forming the band-shaped mask material layers 17a and 17b and then removing the band-shaped mask material layers 17a and 17b in the contact hole C1, C2 formation region. As described above, a method other than the method described in the first embodiment may be employed to form a contact hole C1, C2 formation region. The same applies to other embodiments according to the present invention.

In the first embodiment, as illustrated in FIGS. 1TA to 1TC, the N+ layers 3aa, 3ab, 3ba, and 3bb and the P+ layers 4aa and 4bb serving as sources or drains of SGTs are formed below the Si pillars 6a to 6f and on the N layers 2a and 2b in a connected manner. On the other hand, the N+ layers 3aa, 3ab, 3ba, and 3bb and the P+ layers 4aa and 4bb may be formed in the bottom portions of the Si pillars 6a to 6f, and the N+ layers 3aa, 3ab, 3ba, and 3bb and the P+ layers 4aa and 4bb may be connected to each other through a metal layer or an alloy layer. Alternatively, the N+ layers 3aa, 3ab, 3ba, and 3bb and the P+ layers 4aa and 4bb may be formed so as to be connected to the side surfaces of the bottom portions of the Si pillars 6a to 6f. As described above, the N+ layers 3aa, 3ab, 3ba, and 3bb and the P+ layers 4aa and 4bb serving as sources or drains of SGTs may be formed in the bottom portions of the Si pillars 6a to 6f or may be formed at the outer peripheries of the Si pillars 6a to 6f so as to be in contact with the side surfaces of the Si pillars 6a to 6f, and may be electrically connected to each other through another conductor material. The same applies to other embodiments according to the present invention.

In the first embodiment, the band-shaped mask material layers 9a, 9b, 12aa, 12ab, 12ba, and 12bb are formed such that the upper surfaces are at the same position and the bottoms are at the same position in the vertical direction. However, the upper surfaces may be at different positions and the bottoms may be at different positions in the vertical direction as long as the object of the present invention is achieved. The same applies to other embodiments according to the present invention.

In the first embodiment, the thickness and shape of the band-shaped mask material layers 9a, 9b, 12aa, 12ab, 12ba, and 12bb vary depending on polishing by CMP, etching by RIE, and cleaning. This variation is negligible as long as the object of the present invention is achieved. The same applies to other embodiments according to the present invention.

The material for each of the various wiring metal layers 34a, 34b, WL, Vdd, Vss, BL, and RBL in the first embodiment may be not only a metal, but also a conductive material such as an alloy or a semiconductor containing a large amount of acceptor or donor impurities. The layer formed of such a conductive material may have a single-layer structure or a multilayer structure. The same applies to other embodiments according to the present invention.

In the first embodiment, as illustrated in FIGS. 1JA to 1JC, the TiN layers 24a, 24b, 24c, and 24d are used as gate metal layers. The TiN layers 24a, 24b, 24c, and 24d may each be a material layer having a single-layer structure or a multilayer structure as long as the object of the present invention is achieved. The TiN layers 24a, 24b, 24c, and 24d may each be a conductor layer that at least has a desired work function, such as a metal layer having a single-layer structure or a multilayer structure. Another conductive layer such as a W layer may be formed outside the TiN layers. In this case, the W layer functions as a metal wiring layer for connecting gate metal layers. Instead of the W layer, a metal layer having a single-layer structure or a multilayer structure may be used. Furthermore, the $HfO_2$ layer 23 is used as a gate insulating layer, but another material layer having a single-layer structure or a multilayer structure may be used. The same applies to other embodiments according to the present invention.

In the first embodiment, the planar shape of each of the Si pillars 6a to 6f is a circular shape. For the planar shapes of some or all of the Si pillars 6a to 6f, for example, a circular shape, an elliptical shape, and a shape elongated in one direction may be employed. In a logic circuit region formed apart from the SRAM cell region, Si pillars having different planar shapes can be formed in a mixed manner in accordance with the logic circuit design. The same applies to other embodiments according to the present invention.

In the first embodiment, the $N^+$ layers 3aa, 3ab, 33ba, and 3bb and the $P^+$ layers 4aa and 4bb are formed so as to be connected to the bottom portions of the Si pillars 6a to 6f. A metal layer or an alloy layer formed of a silicide or the like may be formed on the upper surfaces of the $N^+$ layers 3aa, 3ab, 33ba, and 3bb and the $P^+$ layers 4aa and 4bb. A $P^+$ layer or $N^+$ layer containing donor or acceptor impurity atoms may be formed at the outer peripheries of the bottom portions of the Si pillars 6a to 6f by, for example, epitaxial growth to form source or drain impurity regions of SGTs. In this case, an $N^+$ layer or a $P^+$ layer may be formed or may be not formed inside the Si pillar in contact with the $N^+$ layer or the $P^+$ layer formed by epitaxial growth. An elongated metal layer or alloy layer may be disposed so as to be in contact with the $P^+$ layer or the $N^+$ layer. The same applies to other embodiments according to the present invention.

In the first embodiment, SGTs are formed on the P layer substrate 1. Instead of the P layer substrate 1, a SOI (silicon on insulator) substrate may be employed. Another material substrate may be employed as long as it serves as a substrate. The same applies to other embodiments according to the present invention.

In the first embodiment, SGTs in which sources and drains are constituted by forming, on and below the Si pillars 6a to 6f, the $N^+$ layers 3aa, 3ab, 3ba, 3bb, the $P^+$ layers 44b and 44g, the $N^+$ layers 32a, 32c, 32d, and 32f, and the $P^+$ layers 32b and 32e that have the same polarity have been described. The present invention can also be applied to tunneling SGTs including sources and drains having different polarities. The same applies to other embodiments according to the present invention.

In the first embodiment, after formation of the gate $HfO_2$ layer 23 and the gate TiN layers 24a, 24b, 24c, and 24d, the $N^+$ layers 43a, 43c, 43d, 43e, 43f, 44a, 44c, 44d, 44e, 44f, and 44h and the $P^+$ layers 43b, 43g, 44b, and 44g are formed. Alternatively, after formation of the $N^+$ layers 32a, 32c, 32d, and 32f and the $P^+$ layers 32b and 32e, the gate $HfO_2$ layer 23 and the gate TiN layers 24a, 24b, 24c, and 24d may be formed. The same applies to other embodiments according to the present invention.

In the second embodiment, the thin single crystal Si layer 45 is formed by ALD, and the $P^+$ layer 46 containing acceptor impurities is formed by epitaxial growth. The thin single crystal Si layer 45 is a material layer for forming a $P^+$ layer 46 having good crystallinity Another material layer having a single-layer structure or a multilayer structure may be used as long as the $P^+$ layer 46 having good crystallinity is formed.

The vertical NAND-type flash memory circuit includes a plurality of memory cells stacked in the vertical direction, the memory cells each including a semiconductor pillar as a channel and each including, around the semiconductor pillar, a tunnel oxide layer, a charge storage layer, an interlayer insulating layer, and a control conductor layer. Semiconductor pillars at both ends of these memory cells include a source line impurity layer corresponding to a source and a bit line impurity layer corresponding to a drain. In addition, when one of memory cells on both sides of a certain memory cell functions as a source, the other functions as a drain. Thus, the vertical NAND-type flash memory circuit is one of SGT circuits. Therefore, the present invention can also be applied to mixed circuits with NAND-type flash memory circuits.

Various embodiments and modifications of the present invention can be made without departing from the broad spirit and scope of the present invention. The above-described embodiments are illustrative examples of the present invention and do not limit the scope of the present invention. The above-described embodiments and modifications can be freely combined with each other. Furthermore, embodiments from which some of constituent features of the embodiments are removed as required are also within the technical idea of the present invention.

In the pillar-shaped semiconductor device and the method for producing a pillar-shaped semiconductor device according to embodiments of the present invention, a high-density pillar-shaped semiconductor device is provided.

What is claimed is:
1. A semiconductor memory device comprising:
a first semiconductor pillar that stands on a substrate in a first direction;
a second semiconductor pillar that stands adjacent to the first semiconductor pillar on the substrate in the first direction;
a first gate conductor layer that surrounds the first semiconductor pillar, and a second gate conductor layer that surrounds the second semiconductor pillar, wherein the first and second gate conductor layers are connected, respectively, to two separate gate control switches;

a first impurity layer formed to cover a top portion of the first semiconductor pillar;

a second impurity layer formed separately fro the first impurity layer to cover a top portion of the second semiconductor pillar;

a first conductor layer formed on the first impurity layer;

a second conductor layer formed, separately from the first conductor layer on the second impurity layer;

a first band-shaped contact hole formed such that at least part of the first conductor layer and at least part of the second conductor layer are present in the first band-shaped contact hole; and a first wiring conductor layer formed in the first band-shaped contact hole to electrically connect the first and second impurity layers.

2. The semiconductor memory device according to claim 1, further comprising:

a third impurity layer formed in connection with the first impurity layer and the second impurity layer; and a third conductor layer formed on the first impurity layer, the second impurity layer, and the third impurity layer, wherein the first wiring conductor layer is connected to the third conductor layer, and wherein the first band-shaped contact hole is present inside the third conductor layer.

3. The semiconductor memory device according to claim 2, wherein the third conductor layer comprises the first wiring conductor layer.

4. The semiconductor memory device according to claim 1, wherein the first impurity layer and the second impurity layer are semiconductor material layers formed by epitaxial growth.

5. The semiconductor memory device according to claim 1, further comprising a single crystal semiconductor thin film layer formed on side surfaces and bottoms of the first impurity layer and the second impurity layer.

6. A static random access memory (SRAM) cell circuit that comprises the semiconductor memory cell of claim 1, wherein the first semiconductor pillar and the second semiconductor pillar each constitute a load surrounding gate transistor (SGT).

* * * * *

UNITED STATES PATENT AND TRADEMARK OFFICE
CERTIFICATE OF CORRECTION

PATENT NO. : 12,127,386 B2
APPLICATION NO. : 17/567696
DATED : October 22, 2024
INVENTOR(S) : Nozomu Harada It is certified that error appears in the above-identified patent and that said Letters Patent is hereby corrected as shown below:

In the Claims

Column 23, Claim 1, Line 3, delete "fro" and replace with --from--

Signed and Sealed this
Third Day of December, 2024

Katherine Kelly Vidal
*Director of the United States Patent and Trademark Office*